(12) United States Patent
Dutta

(10) Patent No.: US 7,641,733 B2
(45) Date of Patent: Jan. 5, 2010

(54) METHOD AND APPARATUS FOR GROWTH OF MULTI-COMPONENT SINGLE CRYSTALS

(75) Inventor: Partha Dutta, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 5 days.

(21) Appl. No.: 11/660,593

(22) PCT Filed: Sep. 1, 2005

(86) PCT No.: PCT/US2005/031044

§ 371 (c)(1),
(2), (4) Date: Feb. 20, 2007

(87) PCT Pub. No.: WO2006/028868

PCT Pub. Date: Mar. 16, 2006

(65) Prior Publication Data

US 2008/0203361 A1    Aug. 28, 2008

Related U.S. Application Data

(60) Provisional application No. 60/606,132, filed on Sep. 1, 2004.

(51) Int. Cl.
*C30B 15/00* (2006.01)
*C30B 21/06* (2006.01)
(52) U.S. Cl. .............. 117/13; 117/22; 117/36; 117/41
(58) Field of Classification Search ............ 117/13, 117/200–220, 22, 36, 41; 438/460; 257/518.1
See application file for complete search history.

(56) References Cited

U.S. PATENT DOCUMENTS

| 3,305,485 | A | * | 2/1967 | Burmeister et al. | ............ 117/31 |
| 3,716,345 | A | * | 2/1973 | Grabmaier | ............ 117/31 |
| 3,982,261 | A | * | 9/1976 | Antypas | ............ 372/44.01 |
| 4,036,595 | A | * | 7/1977 | Lorenzini et al. | ............ 117/202 |
| 4,167,554 | A | * | 9/1979 | Fisher | ............ 117/209 |
| 4,196,171 | A | * | 4/1980 | Watanabe et al. | ............ 117/209 |
| 4,310,492 | A | * | 1/1982 | Nakanishi et al. | ............ 117/209 |
| 4,532,001 | A | * | 7/1985 | Benchimol et al. | ............ 117/63 |
| 4,728,388 | A | * | 3/1988 | Fillot et al. | ............ 117/42 |
| 4,775,639 | A | * | 10/1988 | Yoshida | ............ 438/94 |
| 4,894,206 | A | * | 1/1990 | Yamashita et al. | ............ 117/213 |
| 5,047,112 | A | * | 9/1991 | Ciszek | ............ 117/18 |
| 5,047,113 | A | * | 9/1991 | Ostrogorsky | ............ 117/83 |

(Continued)

OTHER PUBLICATIONS

NN75091177-Disclosure Title: Production of High Quality Crystals from High Temperature Solutions. Sep. 1975. Publication-Data: IBM Technical Disclosure Bulletin, Sep. 1975, US.*

(Continued)

*Primary Examiner*—Robert M Kunemund
*Assistant Examiner*—G. Nagesh Rao
(74) *Attorney, Agent, or Firm*—Foley & Lardner LLP

(57) ABSTRACT

A method and apparatus for growth of uniform multi-component single crystals is provided. The single crystal material has at least three elements and has a diameter of at least 50 mm, a dislocation density of less than 100 $cm^{-2}$ and a radial compositional variation of less than 1%.

17 Claims, 17 Drawing Sheets

Axial Composition Profile (Example 1)

U.S. PATENT DOCUMENTS

| | | | | |
|---|---|---|---|---|
| 5,064,780 | A | * | 11/1991 | Grijol et al. .................... 117/56 |
| 5,399,503 | A | * | 3/1995 | Saito et al. .................. 438/479 |
| 5,820,649 | A | * | 10/1998 | Ogure et al. .................... 65/66 |
| 5,879,449 | A | * | 3/1999 | Beswick ....................... 117/30 |
| 6,019,841 | A | * | 2/2000 | Jafri et al. .................... 117/201 |
| 6,273,969 | B1 | * | 8/2001 | Dutta et al. ................. 148/404 |
| 6,613,162 | B1 | * | 9/2003 | Dutta et al. ................. 148/512 |
| 7,344,598 | B2 | * | 3/2008 | Lan et al. .................... 117/221 |
| 2005/0092236 | A1 | * | 5/2005 | Bender ....................... 117/200 |
| 2007/0034250 | A1 | * | 2/2007 | Dutta ......................... 136/244 |
| 2007/0209573 | A1 | * | 9/2007 | Kusunoki et al. ............. 117/28 |
| 2008/0203361 | A1 | * | 8/2008 | Dutta ....................... 252/518.1 |

OTHER PUBLICATIONS

NN7408903-Disclosure Title: Controlled Crystal Pulling With Accelerated Crucible Rotation. Aug. 1974. Publication-Data: IBM Technical Disclosure Bulletin, Aug. 1974, US.*

Bachmann et al., "Melt and Solution Growth of Bulk Single Crystals of Quaternary III-V Alloys," Progress in Crystal Growth and characterization, 2(3), 171-206, 1979.

Dutta et al., :"The physics and technology of gallium antimonide: An emerging optoelectronic material," J. Appl. Phys., 81(9), May 1, 1997, 5821-5870.

Kunitsyna et al., Growth of $Ga_{1-x}In_xAs_ySb_{1-y}$, solid solutions from the five component Ga-In-As-Sb-Pb melt by liquid phase epitaxy, Applied Surface Science, 142, 1999, pp. 371-374.

Dutta et al., "Engineering Phase Formation Thermo-Chemistry for Crystal Growth of Homogeneous Ternary and Quaternary III-V Compound Semiconductors from Melts," J. Elect. Mat., 2000, 29(7), 956-963.

Singh, Jasprit, Instructor's Manual to Accompany Semiconductor Devices, Basic Principles, Chapter 5, "Semiconductor Device Processing: An Overview," 2001, John-Wiley & Sons, from www.eecs.umich.edu/~singh, 10 pgs.

* cited by examiner

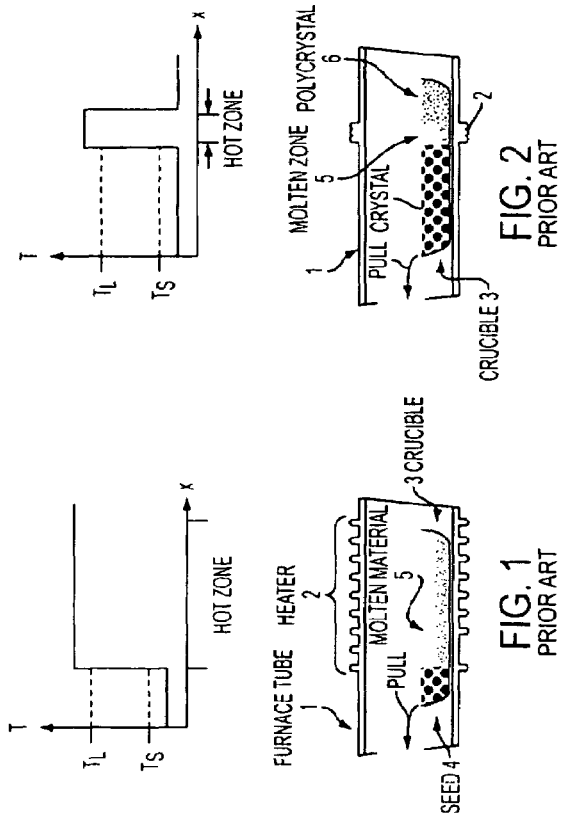
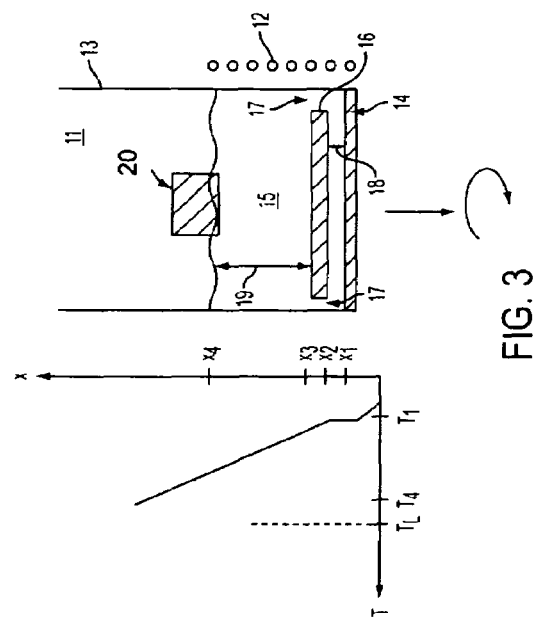

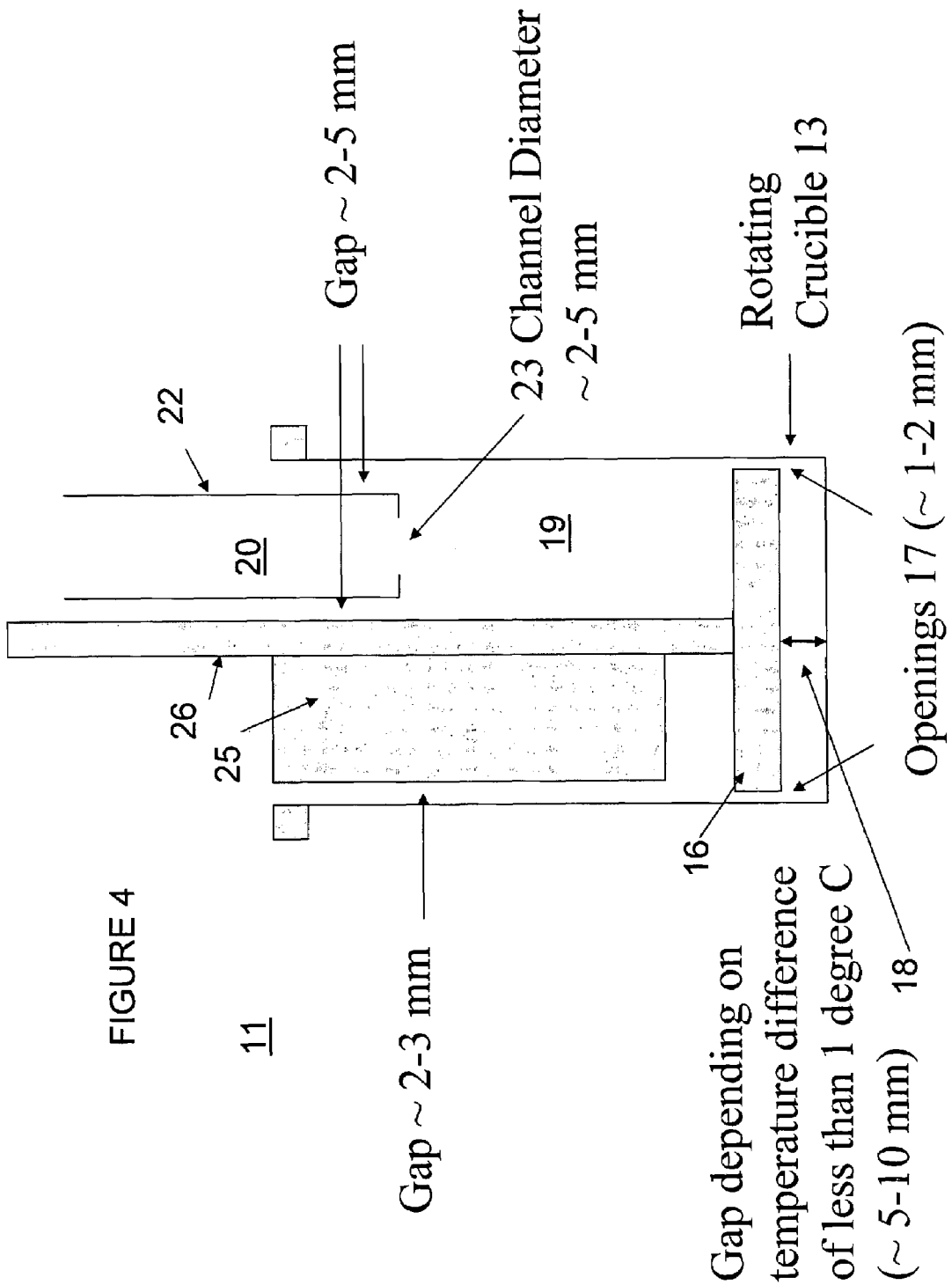

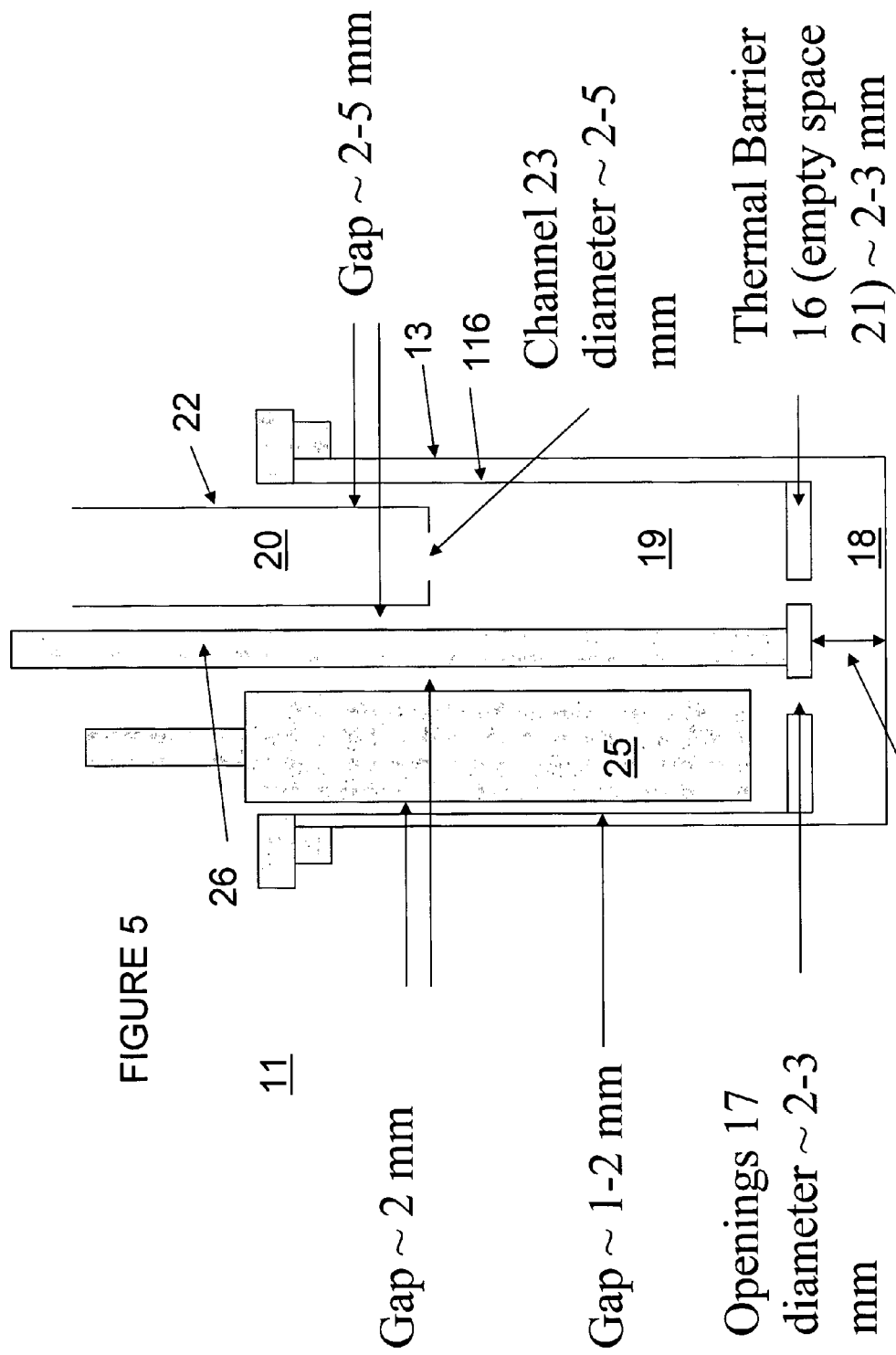

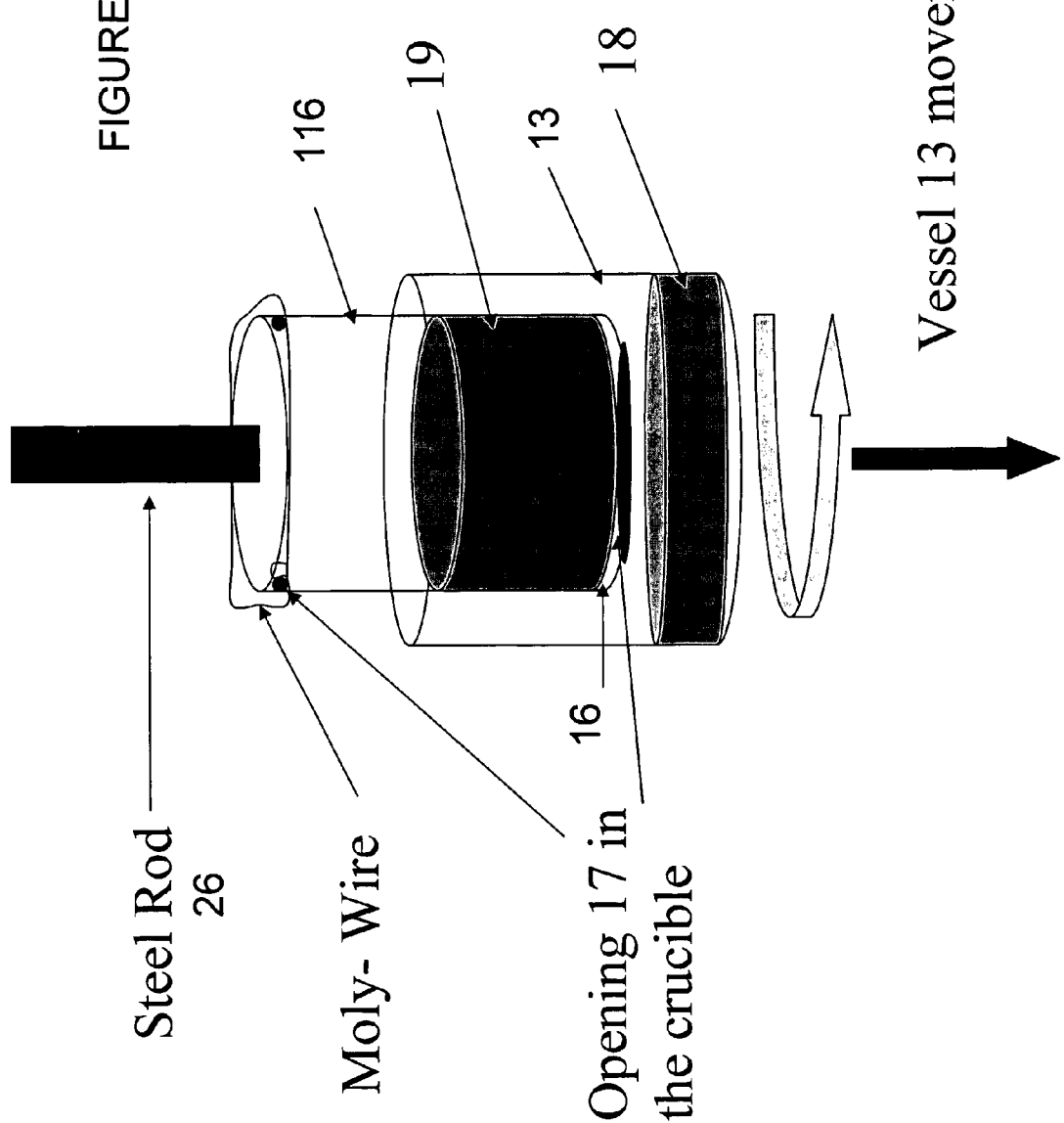

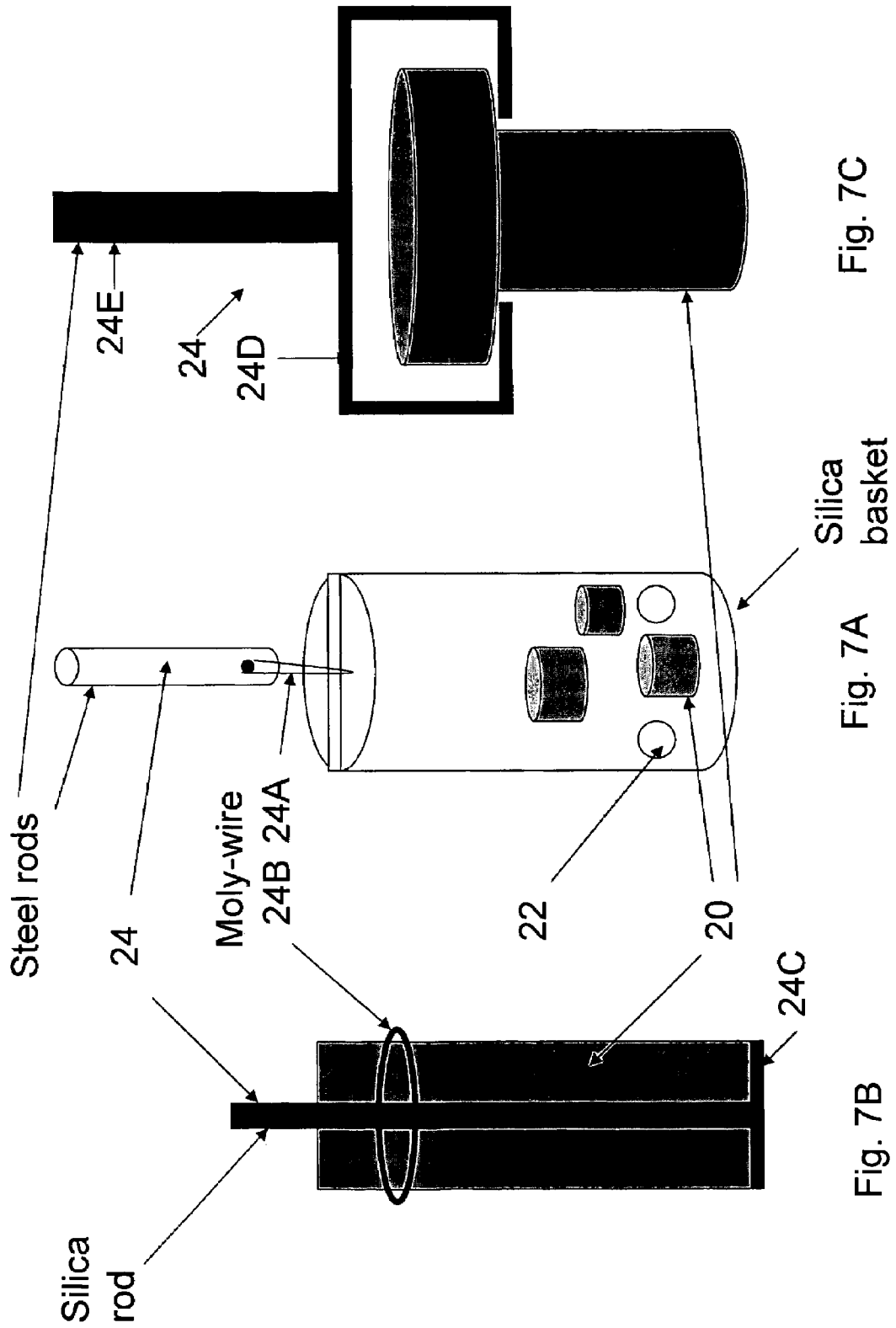

METHOD AND APPARATUS FOR GROWTH OF MULTI-COMPONENT SINGLE CRYSTALS

CROSS-REFERENCE TO RELATED PATENT APPLICATIONS

This application claims benefit of priority of U.S. Provisional Application Ser. No. 60/606,132, filed on Sep. 1, 2004, which is incorporated herein by reference in their entirety.

The U.S. government may have certain rights in this invention pursuant to grant numbers ECS 0093706 from NSF, N00014-02-1-0458 from ONR and F33615-98-D-5438 from AFOSR.

FIELD OF THE INVENTION

The subject invention relates, generally, to crystal growth and, more particularly, to ternary and quaternary homogeneous single crystals and to methods and apparatus for making such alloys.

BACKGROUND OF THE INVENTION

III-V and II-VI compound semiconductors with variable band gaps ($E_g$) and lattice constants are needed for numerous electronic and optoelectronic applications, including light emitting diodes, laser diodes, photodetectors, solar and photovoltaic cells, high speed switches, and the like. Directional solidification from the melt is by far the fastest, cheapest, most reliable, and, therefore, the preferred method for producing large scale, device grade, single crystal substrates. Unfortunately, only binary compounds (like GaAs, GaSb, and InP) have been successfully commercially produced in large quantities from melts having discrete energy band gaps and lattice constants. In principle, the band gap and the lattice constant can be tuned in ternary, quaternary, or higher order systems by adjusting the composition of the substitutional cations and anions. However, in practice melt-grown ternary and higher order compounds are compositionally inhomogeneous (see, e.g., Bachmann et al., "Melt and Solution Growth of Bulk Single Crystals of Quaternary III-V Alloys", Progress in Crystal Growth and Characterization, 2(3):171-206 (1979)) and exhibit high density of defects, such as cracks, inclusions, precipitates, dendrites, and dislocations. These defects are due to several reasons, including large lattice mismatch between the constituent binaries, wide separation between the liquidus and solidus curves in the pseudo-binary phase diagrams, differences in thermal expansion coefficients of the binary compounds, and miscibility gaps.

FIG. 1 illustrates a conventional horizontal Bridgeman apparatus 1 for growing a binary semiconductor single crystal boule. In this method, a crucible 3 containing a crystal growth seed 4 is pulled through a wide hot zone of a furnace having heater coils 2 or other heating elements. The semiconductor material contacting the crystal growth seed and which has already passed through the hot zone of the heater coils is solid. The remainder of the semiconductor material 5 located in the hot zone of the furnace is in the liquid state. Thus, the temperature in the hot zone of the furnace is maintained above the liquidus temperature of the binary semiconductor material. The temperature versus location plot in FIG. 1 shows that the temperature in the hot zone is sufficient to maintain the semiconductor material in the hot zone in the liquid state.

FIG. 2 illustrates a conventional horizontal Floating Zone apparatus for growing a binary semiconductor single crystal boule. In this method, a crucible 3 containing a crystal growth seed 4 is pulled through a narrow hot zone of a furnace having heater coils 2 or other heating elements. The semiconductor material contacting the crystal growth seed and which has already passed through the hot zone of the heater coils is a solid single crystal. The narrow portion 5 of the semiconductor material located in the hot zone of the furnace is in the liquid state. The tail portion 6 of the polycrystalline semiconductor material that has not yet passed through the hot zone is in the solid state. The temperature versus location plot in FIG. 2 shows that the temperature in the tail portion 6 behind the hot zone 2 is maintained below the solidus temperature of the semiconductor material to keep the semiconductor material in the tail portion in the solid state.

Ternary and quaternary semiconductor materials are currently produced in the form of thin layers by non-equilibrium growth techniques (from diluted solutions and vapor phase) on binary substrates using buffer layers to relieve misfit related stresses at the epilayer-substrate interface. One disadvantage of epitaxial technology is its high cost. In addition, the buffer layer technology is not optimized for all systems, and, often devices exhibit large leakage currents due to poor interfacial regions.

BRIEF DESCRIPTION OF THE DRAWINGS

FIGS. 1-2 schematically illustrate side cross sectional views of prior art crystal growth apparatuses.

FIGS. 3-6, 7D, 7E, 7F and 8-11 schematically illustrate side cross sectional views of apparatuses of the preferred embodiments of the present invention.

FIGS. 7A, 7B and 7C schematically illustrate three dimensional views of apparatuses of the preferred embodiments of the present invention.

DESCRIPTION OF THE EMBODIMENTS OF THE INVENTION

Figure 7D:
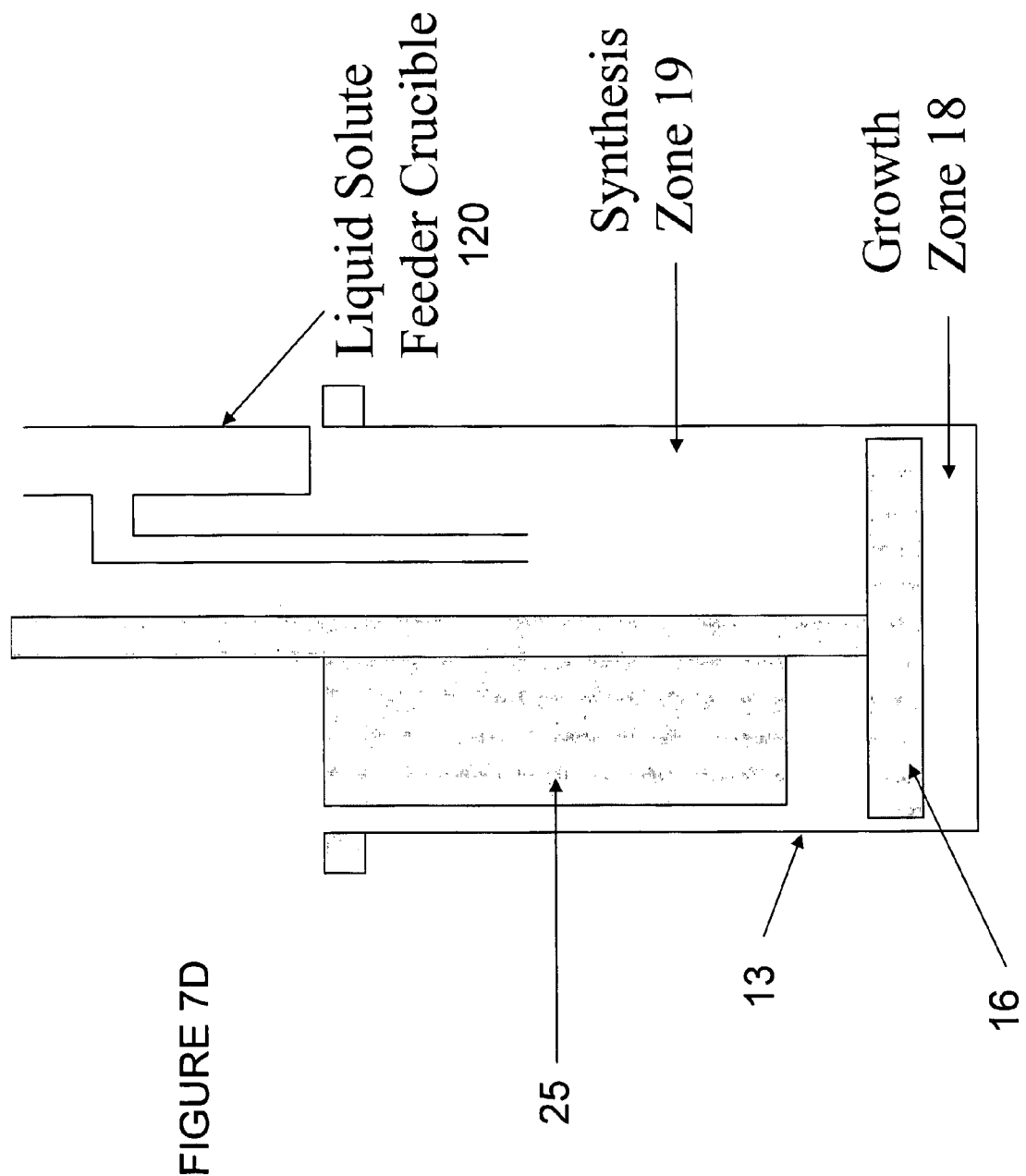

The present inventor has realized that a method of growing a multi-component single crystal having three or more elements with high quality and high growth rate may be obtained by growing the single crystal on a crystal growth seed from a multi-component melt, such as a ternary, quaternary or higher order (i.e., quinternary) melt. It should be noted that the crystal and melt do not necessarily have the same number of elements or components. The crystal growth seed is located in a crystal growth area of a vessel, such as a crucible or another suitable vessel. The vessel is separated into a crystal growth area and a synthesizing melt area by a thermal barrier. At least one opening connects the crystal growth area to the synthesizing melt area. A growth melt is formed in the crystal growth area of the vessel and a synthesizing melt is formed in the synthesizing melt area of the vessel. A solute, such as a solid or liquid solute is provided into the synthesizing melt, such that solute diffuses from the synthesizing melt into the growth melt through the at least one opening. The multi-component single crystal having three or more elements, such as a ternary or quaternary single crystal, is grown on the crystal growth seed. Preferably a temperature difference between the thermal barrier and a crystal growth surface over the crystal growth seed is 1° C. or less, and a temperature difference between the thermal barrier and a location in the synthesizing melt where the solute is provided is 20° C. or more.

FIG. 3 illustrates an apparatus 11 according to one embodiment of the present invention. The apparatus 11 contains a heating element 12 and a vessel 13. The heating element 12 may be any suitable heating element which provides heat to the vessel 13. For example, the heating element 12 may comprise a furnace, such as a furnace with resistive heating coils. Alternatively, the heating element 12 may comprise an RF heating element containing RF coils, or a radiative energy heating element 12, such as a heating element containing one or more heating lamps or flash lamps. The vessel 13 may be any vessel for single crystal growth from a melt, such as a crucible made of quartz, pyrolitic boron nitride (pBN) or other thermally tolerant materials which are chemically compatible with the melt and solid materials used in the process. Preferably, the vessel 13 is vertically oriented.

A crystal growth seed 14 is located at the bottom of the vessel 13. The seed preferably comprises a single crystal of the same material as that being grown in the vessel. Thus, for example, to grow a ternary $Ga_{0.75}In_{0.25}Sb$ single crystal, a $Ga_{0.75}In_{0.25}Sb$ single crystal seed 14 is provided on the bottom of the vessel 13.

As described above, a multi-component melt 15 is located in the vessel. Preferably, the melt 15 has as many elements or components as in the single crystal being grown on the seed 14. Thus, for a ternary single crystal, a ternary melt may be used. For a quaternary single crystal, a quaternary melt may be used. However, if desired, a higher order melt may be used for a lower order single crystal, as described for example in U.S. Pat. No. 6,613,162 (quaternary melt for ternary crystal) and E. V. Kunitsyna et al., 142 Appl. Surf. Sci. 371-374 (1999) (quinternary melt for quaternary crystal), both incorporated herein by reference in their entirety.

A thermal barrier 16 is located in the vessel 13. The thermal barrier 16 may comprise a plate or a second vessel, such as a second crucible, of a smaller diameter than the vessel 13. The thermal barrier 16 is made of any suitable low thermal conductivity (i.e., thermally insulating) material and has a sufficient thickness which prevents or significantly decreases thermal conductivity from one side of the barrier 16 to the other side of the barrier 16. For example, as shown in FIG. 4, the thermal barrier 16 may comprise a silica or quartz plate having a thickness of about 0.25 to 1 cm, such as 0.5 cm, for example. Alternatively, as shown in FIGS. 5 and 6, the thermal barrier 16 comprises at least a portion of a second vessel, such as a second crucible 116. The second vessel 116 has a smaller diameter or width than the first vessel 13, such that the second vessel 116 fits inside the first vessel 13. a gap of 1-2 mm exists between the sidewalls of the vessels 13 and 116. For example, the second vessel 116 may have a hollow bottom wall 21, containing a 2-3 mm hollow space between the inner and outer bottom wall surfaces. The hollow wall 21 forms a low thermal conductivity thermal barrier. Alternatively, the second vessel 116 is made from a low thermal conductivity material, such as silica or quartz, and has a sufficiently thick bottom wall which forms a low thermal conductivity thermal barrier. For example, the bottom wall may be a 0.25 to 1 cm thick quartz or silica wall. The synthesizing melt 19 is located in vessel 116. As support rod and wire structure 26 may be used to move and support the vessel 116, as shown in FIG. 6.

One or more openings 17 connect the lower area or zone 18 of the vessel 13 to an upper area or zone 19 of the vessel 13. The openings 17 may comprise one or more openings located in the thermal barrier 16, one or more openings located between the thermal barrier 16 and an internal side wall of the vessel 13, or a plurality of openings located both in the thermal barrier 16 and between the thermal barrier 16 and an internal side wall of the vessel 13. For example, as shown in FIGS. 3 and 4, if the thermal barrier 16 comprises a plate, then the openings 17 comprise one or more spaces between the edges of the plate 16 and the internal sidewall of vessel 13. In another example, if the thermal barrier 16 comprises at least one wall of an internal vessel or crucible 116, then the openings may comprise one or more openings in the bottom wall of such internal vessel or crucible.

When the melt 15 is present in the vessel 13, the thermal barrier 16 separates the melt 15 into a crystal growth melt area or zone 18 and a synthesizing melt area or zone 19. The thermal barrier 16 substantially prevents thermal transfer between the synthesizing melt 19 and the growth melt 18 but allows solute 20 transport from the synthesizing melt 19 to the growth melt 18 by solute diffusion through the at least one opening 17. Therefore, the size of the openings 17 is preferably maintained as small as possible to allow the solute diffusion from area 19 to area 18 without substantial thermal transfer from area 19 to area 18. Preferably, the opening(s) 17 has a width (or diameter for round openings) of 2 mm or less, such as 1-2 mm for example. In a vertically oriented vessel 13, crystal growth seed 14 is located on a bottom of the vessel 13, the synthesizing melt area 19 is at a top of the vessel and the crystal growth area 18 is located between the seed 14 and the synthesizing melt area 19.

A solute 20 is provided into the synthesizing melt 19. In one preferred aspect of the present invention shown in FIGS. 3 and 4, the solute is in a solid state. However, the solute 20 may be in a liquid or semi-solid state, as will be described in more detail below. Preferably, the solute 20 comprises a material having a higher melting point than that of the melt 15. Preferably, the solute 20 comprises a binary material while the melt 15 comprises a ternary or quaternary material having a lower melting point.

For example, when the crystal growth seed 14 and the growth melt 18 comprise a ternary material having a compositional formula $A_{1-x}B_xC$, the synthesizing melt 19 comprises a ternary material having a compositional formula $A_{1-y}B_yC$, where x>y, then solute 20 comprises a binary material having a compositional formula AC. In this case, when the element A is depleted from the growth melt 18 into the single crystal being grown on the seed 14, then the solute provides a sufficient amount of element A into the synthesizing melt 19. Element A then diffuses from the synthesizing melt 19 through the openings 17 into the growth melt 18 to keep the growth melt composition about the same as that of a liquidus composition corresponding to a composition of the crystal being grown (i.e., solidus composition). The growth rate of the crystal is depended on the solute saturation of the synthesizing melt. For example, for a GaInSb single crystal, A comprises gallium, B comprises indium and C comprises antimony. For a GaInAs single crystal, A comprises gallium, B comprises indium and C comprises arsenic. For a lithium niobate single crystal, A comprises lithium, B comprises niobium and C comprises oxygen (i.e., to form lithium oxide and niobium pentoxide compositions). In general for ternary alloy single crystals, A comprises a first metal element, B comprises a second metal-element and C comprises a semi-metal or non-metal element.

The solid solute 20 may be provided into the synthesizing melt by any suitable method. For example, one or more chunks of the solid solute 20 may be placed or dropped into the synthesizing melt, as shown in FIG. 3. Alternatively, the solute 20 is provided into the synthesizing melt 19 by repeatedly (i.e., periodically) dipping the solid solute 20 into the synthesizing melt 19 and removing the solid solute 20 from the synthesizing melt 19. For example, the solid solute 20 may be dipped into the synthesizing melt for 10 seconds to 2 minutes at a frequency of once every 5 minutes to once every hour, such as for 1 minute every 30 minutes. The duration and frequency of the solute dipping are selected to achieve the desired crystal growth rate and saturation conditions (which are a function of the solute dipping duration and frequency). The solute dipping conditions depend on various process parameters, such as the materials of the solute, the melt and the single crystal, as well as the temperature of the process.

The solute 20 may be dipped into the synthesizing melt 19 by any suitable method. For example, as shown in FIGS. 4 and 5, the solute 20 may be located in a solute feeder vessel 22 having at least one opening 23 which is dipped into the synthesizing melt 19. The opening 23 may be 2-5 mm wide, for example. The vessel 22 may be a wire mesh basket or a crucible with openings, where are made of a material which will not deform in the synthesizing melt, such as a silica crucible shown in FIG. 7A. The vessel 22 is moved down toward the melt 19 and up out of the melt 19 either by hand or mechanically. For example, the vessel 22 may be attached to a rod or other support which is moved along a vertical axis by a motor. As shown in FIG. 7A, the vessel 22 comprises a basket with one or more holes which is attached to a steel rod 24 by a molybdenum wire 24A. A gap of about 2-5 mm remains between the vessel 22 and the vessel 13 and its components.

Alternatively, the solid solute may be attached to a handle 24 which supports the solid solute 20 while the solute is dipped into and removed from the synthesizing melt. The handle 24 may be moved vertically either manually or mechanically. For example, one or more solid solute 20 rods may be attached to sides of the handle 24, such as a silica rod, with molybdenum wire 24B at the top of the solute rods, as shown in FIG. 7B. The silica rod 24 may also have a bottom support 24C to prevent slippage of the solute rods. Alternatively, the solid solute 20 rod may be grown or formed with a "T"-like shape (i.e., having a wider upper portion than lower portion or having notches below the upper portion), as shown in FIG. 7C. The solid solute 20 rod is then attached to a handle 24 comprising a steel ring 24D attached to a steel rod 24E. The ring 24D slips around the narrow part of the solid solute 20 rod, as shown in FIG. 7C. The solid solute 20 rod is then suspended from the ring 24D by the wider upper portion of the solid solute 20 rod which is wider than the diameter of the ring 24D.

Figure 7E:
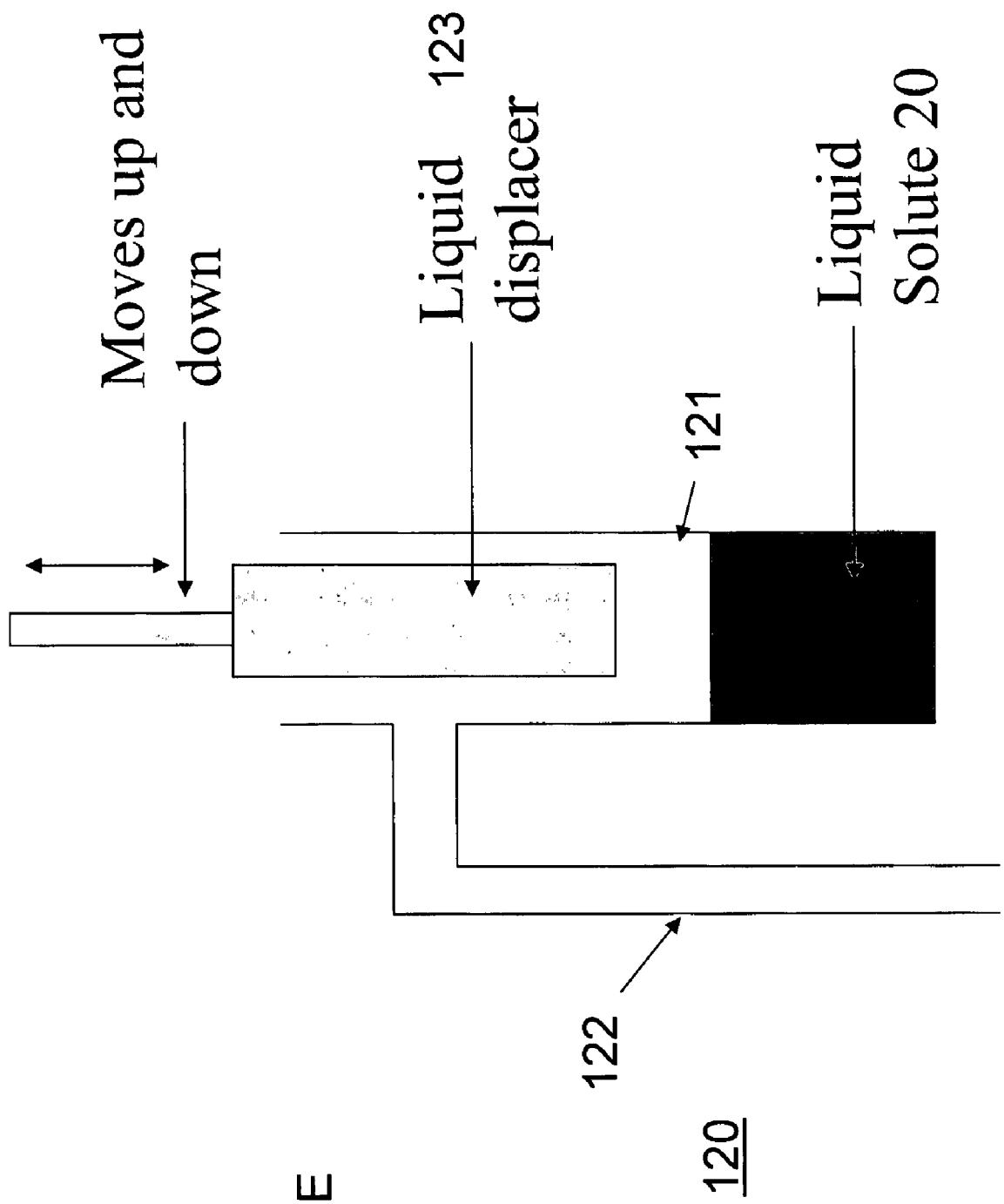
Figure 7F:
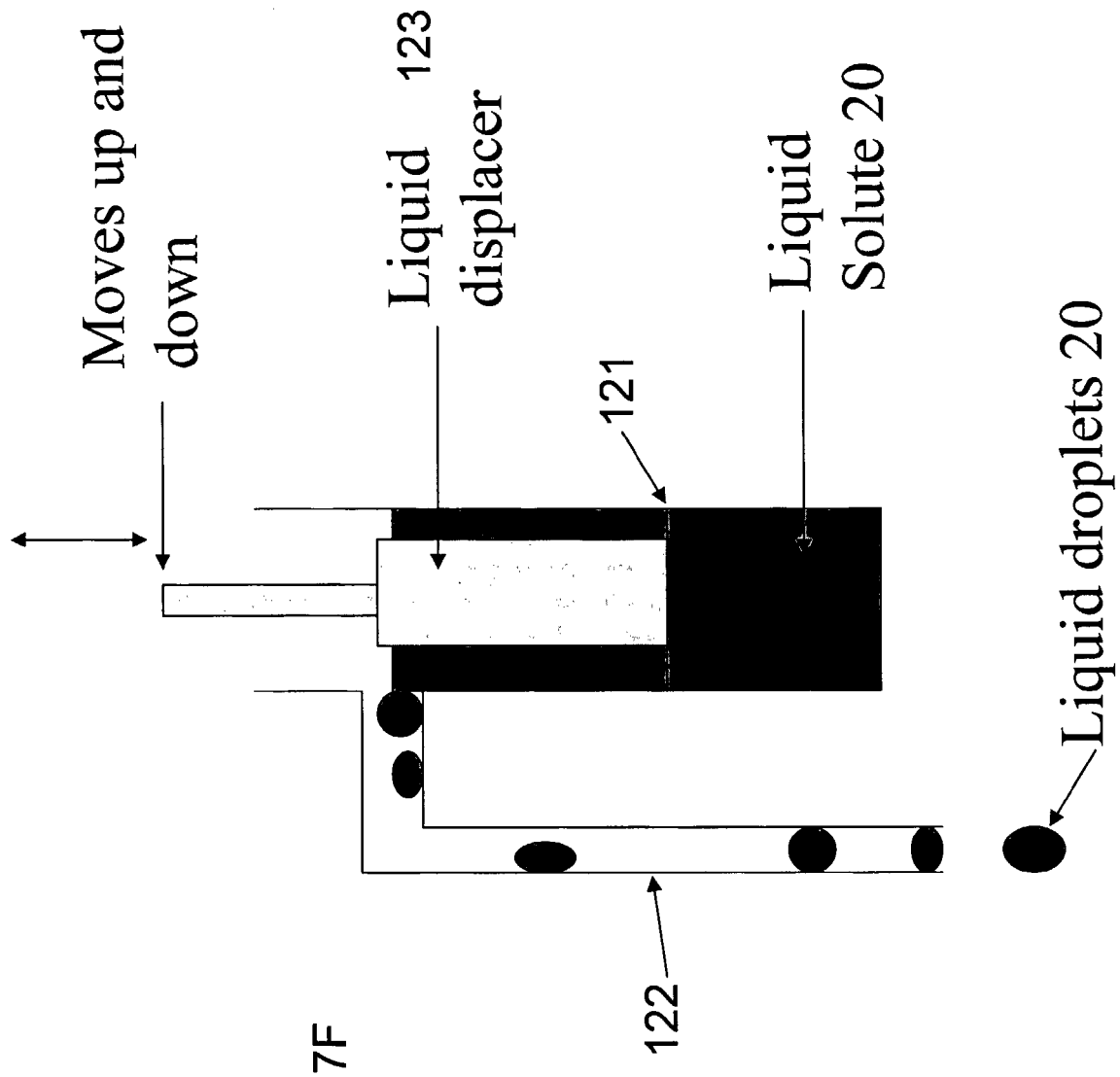

If desired, a liquid or a semi-solid solute 20 may be used instead of a solid solute 20. For example, as shown in FIGS. 7D-F, a liquid solute feeder vessel 120 may be used to provide the liquid solute into the melt. The liquid solute feeder vessel 120 does not need to actually contact the melt 19 or to move in a vertical plane. For example, the vessel 120 may be a crucible made of a material the same as or similar to that of the vessel 13. The vessel 120 may be heated by a heater to maintain the solute in the liquid state.

The vessel 120 preferably comprises a liquid solute container 121 containing an outlet or nozzle 122. In one aspect of this embodiment, the outlet or nozzle is located on the sidewall of the container 121. The container 121 is filled with the liquid solute 20 to a level below the outlet or nozzle 122 in the sidewall of the container 121. As shown in FIG. 7E, a liquid displacer 123, such as a rod or bar made of the same or similar material as the stirrer 25, moves vertically in the container 121 to displace the liquid solute 20. The displaced liquid solute 20, such as solute 20 drops, are provided into the outlet or nozzle 122 because the displacer 123 causes the liquid solute 20 level in the container 121 to rise above the outlet or nozzle 122 in the container 121 sidewall. As shown in FIG. 7F, the liquid solute 20 is provided from the outlet or nozzle 122 into the synthesizing melt 19 in vessel 13. The vertical movement of the displacer 123 is correlated to the exact amount of liquid solute 20 that flows through the outlet or nozzle 122 into the synthesizing melt 19.

Of course other liquid solute vessel 120 designs may be used. For example, the nozzle 122 may be omitted and the displacer 123 may cause the solute 20 to flow over the upper edge of the container 121. Alternatively, the displacer 123 may be omitted and the amount of solute 20 provided into the synthesizing melt may be controlled by a high temperature valve. In this case, the outlet or nozzle 122 may be located in the bottom wall of the container 121.

It should be noted that while a single solute vessel 22, 120 has been illustrated in the Figures, more than one solute vessels 22, 120 may be provided in the crystal growth apparatus. The plurality of vessels may contain the same or different solute. For example, for a quaternary GaInAsSb melt, separate GaSb and GaAs solutes may be provided from separate vessels into the melt.

For example, the plural solute vessels 22, 120 may be used to form a boule containing two or more regions stacked in the axial direction of the boule which have different characteristics. For example, the plural solute vessels may be used to form a boule with one or more p-n junctions (i.e., a p-type region contacting an n-type region), a boule containing regions of materials with different doping concentration (i.e., heavily doped, medium doped, lightly doped and/or intrinsic regions), a boule containing regions of different single crystal materials, and/or a boule containing regions of different relative concentrations of elements in ternary or quaternary materials, stacked in the axial direction of the boule.

The boule may have one or more types of these regions in any combination, where the term "type" includes: i) doping type (p or n); ii) doping concentration type (heavy, medium, light or intrinsic); iii) material type (such as AlGaSb, GaAs and/or GaSb, for example); and iv) relative element concentration type (i.e., $Ga_{1-x}In_ySb$ and $Ga_{1-y}In_ySb$, where 0<x, y<1 and x does not equal y, which can be generalized to $A_{1-x}D_xE$ and $A_{1-y}D_yE$ (where the concentration of group III element is varied), or $AD_{1-x}E_x$ and $AD_{1-y}E_y$ (where the concentration of group V element is varied, such as $GaAs_{1-x}P_x$ and $GaAs_{1-y}P_y$) for ternary materials where A, D and E are elements found in ternary materials). In other words, a single crystal boule may have two or more regions with different characteristics, where all of the regions with different characteristics may be of the same or different types. Thus, a boule may be provided with some or all semiconductor regions of a semiconductor device without requiring epitaxial semiconductor layer deposition, such as CVD, MBE, sputtering, etc. semiconductor layer deposition, over a substrate.

For example, a boule may be provided with p+/p/n/n+ regions stacked together in the axial direction to form a solar cell, a photodetector or a light emitting device, such as an LED or a laser diode. The differently doped regions (by doping type and doping concentration type) may also be made from different semiconductor materials and/or may have different relative concentrations of elements. The boule is then sliced and electrodes are attached to the heavily doped regions to form a completed semiconductor device. The different regions do not include a boundary between the regions which is found in devices in which one layer is epitaxially grown over another layer or substrate. Furthermore, while antimonide III-V materials are used in illustrative examples, the boule may contain other III-V materials, such as nitride, arsenide and/or phosphide materials, as well as other semiconductor systems, such as II-VI materials.

The formation of regions with different characteristics in a boule may be conducted by placing a first solid or liquid solute in a first solute vessel 22, 120 and by placing a second solid or liquid solute with different characteristics from the first solute in a second solute vessel 22, 120. Then, a boule with different characteristic regions stacked in the axial direction is formed by alternately providing the solute from each vessel into the synthesizing melt 19. The solute vessels 22, 120 may be separately provided into the vessel 13 containing the synthesizing melt 19 by first lowering the first solute vessel 22, 120 into vessel 13 while the second solute vessel 22, 120 is raised out of vessel 13, followed by raising the first solute vessel out of vessel 13 and lowing the second solute vessel into vessel 13. If desired, there may be three or more solute vessels 22, 120 to form three or more regions having different characteristics. Each solute vessel 22, 120 contains a solute with a different characteristic(s) from the solute(s) in the other vessel(s) 22, 120, where the different characteristics may be of the same or different type.

Preferably, the heating provided by the heating element 12 is controlled such that a temperature difference between the thermal barrier 16 and a growth surface over the crystal growth seed 14 (i.e., between points x1 and x2 in FIG. 3) is 1° C. or less, such as 0.5° C. or less. In other words, the temperature variation across the growth melt 18 is kept to one degree Celsius or less. Therefore, the growth melt area 18 is preferably maintained as small as possible. Preferably, the thermal barrier (i.e., the lowest portion of the barrier) 16 is located 1 cm or less, such as 0.5 cm or less, from the multi-component single crystal surface facing the thermal barrier during the growth of the multi-component single crystal. Therefore, the height of the growth melt is preferably 0.2 to 1 cm, such as 0.2 to 0.5 cm. However, this distance may be greater than 1 cm if the heating element 12 is controlled to provide a temperature variation of less than one degree Celsius across a growth melt having a height greater than 1 cm. The crystal growth melt 18 is preferably maintained at a temperature such that the seed 14 is maintained at the single crystal alloy's solidus temperature, with a one degree or less variation across the growth melt 18.

Preferably, the heating provided by the heating element 12 is controlled such that a temperature difference between the thermal barrier 16 and a location in the synthesizing melt 19 where the solute 20 is provided (i.e., between points x3 and x4 in FIG. 3) is 20° C. or more, such as 20 to 50° C. In other words, the temperature gradient across the synthesizing melt 19 is preferably greater than 20 degrees Celsius from the bottom of the synthesizing melt 19 (located at the top of the thermal barrier 16) to the top of the synthesizing melt 19 where the solute 20 is dipped.

The synthesizing and growth melts are preferably mixed during crystal growth by any suitable method to maintain homogeneous melt composition distribution and to reduce formation of solute pockets. Preferably, the synthesizing melt is mixed in first mixing step, and the growth melt is mixed in a second mixing step different than the first mixing step. For example, the first mixing step may comprise mixing the synthesizing melt 19 using a stirrer 25 located in the synthesizing melt during the crystal growth method while the second mixing step comprises rotating the vessel 13 using an accelerated crucible rotation (ACRT) method. In other words, the vessel 13 is periodically accelerated and decelerated in its rotation about its axis in the ACRT method to mix the growth melt 18.

Furthermore, the stirrer 25 located in the synthesizing melt 19 while the vessel 13 rotates about its axis mixes the synthesizing melt 19. The stirrer 25 may comprise one or more plates or baffles attached to a supporting rod 26. Preferably, a gap of 2-3 mm is provided between the stirrer 25 and the vessel 13 or 116. The supporting rod 26 may also support a plate type thermal barrier 16, as shown in FIG. 4. The rod 26 may move the plate 16 and baffles 25 together. Alternatively, the thermal barrier 16 and stirrer 25 may be supported by different, mutually exclusive supporting members.

The stirrer 25 may rotate and/or move in one or more directions, such as in vertical and/or horizontal directions, in the synthesizing melt 19, or it may remain stationary in the melt 19. Furthermore, if the thermal barrier 16 comprises a portion of an inner crucible 116 shown in FIGS. 5 and 6, then the inner crucible 116 may be rotated about its axis to mix the synthesizing melt 19. A motor (not shown) may be used to move and to rotate the stirrer or the inner crucible.

For example, the inner crucible 116 or the plate shaped thermal barrier 16 can be oscillated back and forth in the vertical direction by 1-2 mm to help transport the solute 20 from the top of the melt to the bottom of the melt without creating significant temperature fluctuation. While the solute 20 will be transported faster by this mechanism, if the movement is such that only the liquid in the opening(s) 17 gets displaced, which corresponds to movement of 1-2 mm, significant temperature fluctuation will not occur at the growth interface. This movement increases the growth rate by enhancing the solute transport rate from the point it was dissolved in the synthesis melt 19 to the point it is supposed to reach in the growth melt 18. However, the vertical oscillatory movement should not exceed a few millimeters because this will cause a temperature fluctuation due to excessive liquid exchange between the synthesizing and growth melts.

If desired, a melt displacing material may be placed into the synthesizing melt 19 to decrease the volume of the synthesizing melt. The melt displacing material may comprise a rod or plate of material which does not dissolve in the synthesizing melt, such as a graphite, quartz or silica rod.

In order to obtain a single crystal having a substantially uniform axial compositional profile, as the single crystal grows in size, the thermal barrier 16 remains substantially stationary (i.e., is kept in the same horizontal plane or is periodically raised and lowered by 1-2 mm) while the vessel 13 is lowered at about the same rate that as the crystal growth rate. In this case, the crystal growth surface remains at the same horizontal level and is thus maintained at the same temperature during growth.

In order to obtain a single crystal having a uniform radial but a variable axial compositional profile, as the single crystal grows in size, the vessel 13 remains in the same horizontal plate while the thermal barrier 16 is raised at about the same rate as the crystal growth rate. In this case, the crystal growth surface moves up to a higher position with respect to the heater 12 as the crystal grows. The changing temperature at the crystal growth surface with time will result in a variable axial compositional profile. In this case, the single crystal will have a gradually increasing amount of solute element (i.e., element A) in the axial direction away from the crystal growth seed. In other words, a GaInSb single crystal will have a gradually increasing Ga concentration in an axial direction away from the seed. The term "axial" refers to the growth direction of the single crystal, while the term "radial" refers to a direction perpendicular to the growth direction.

Figure 8:
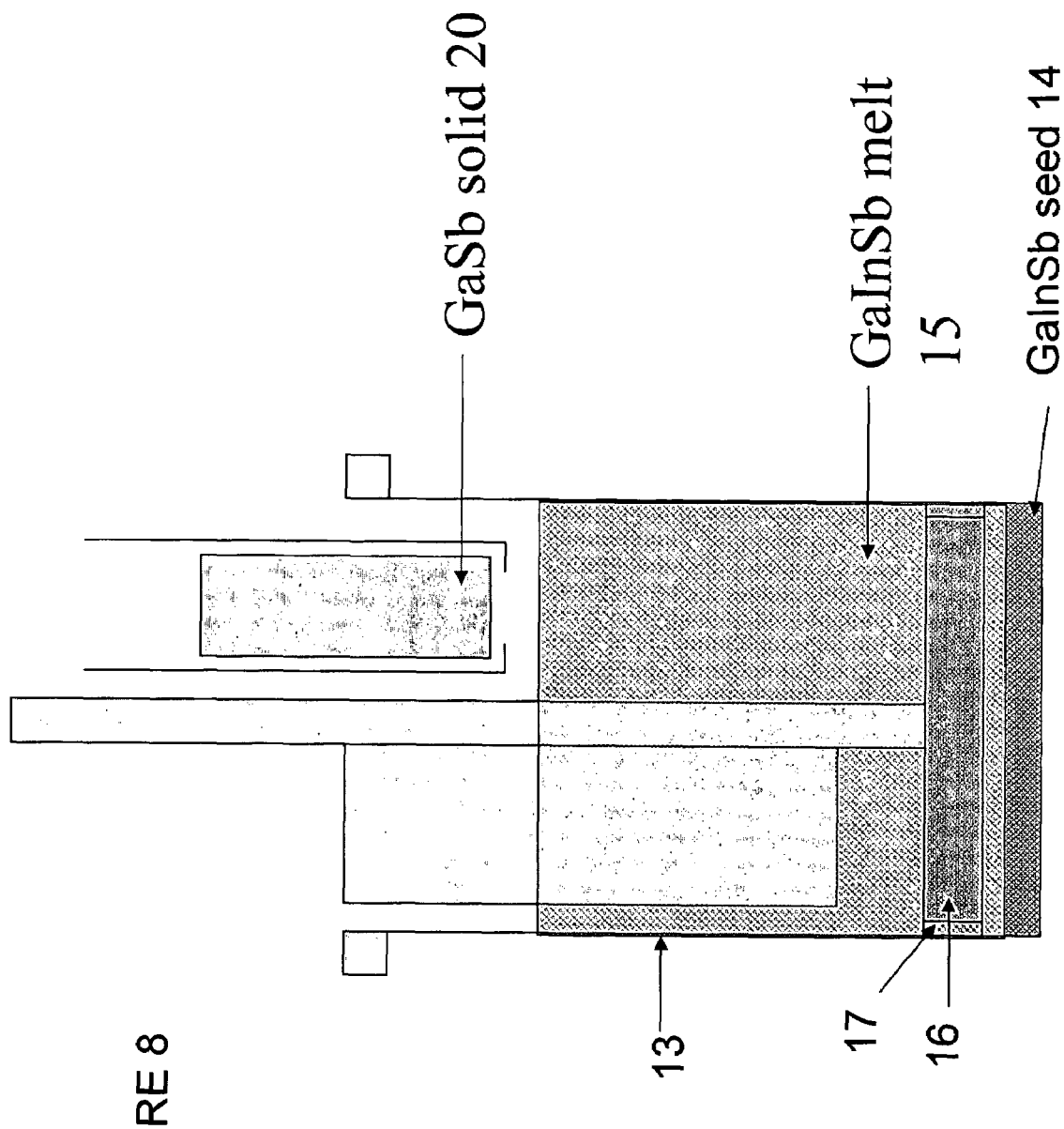
Figure 9:
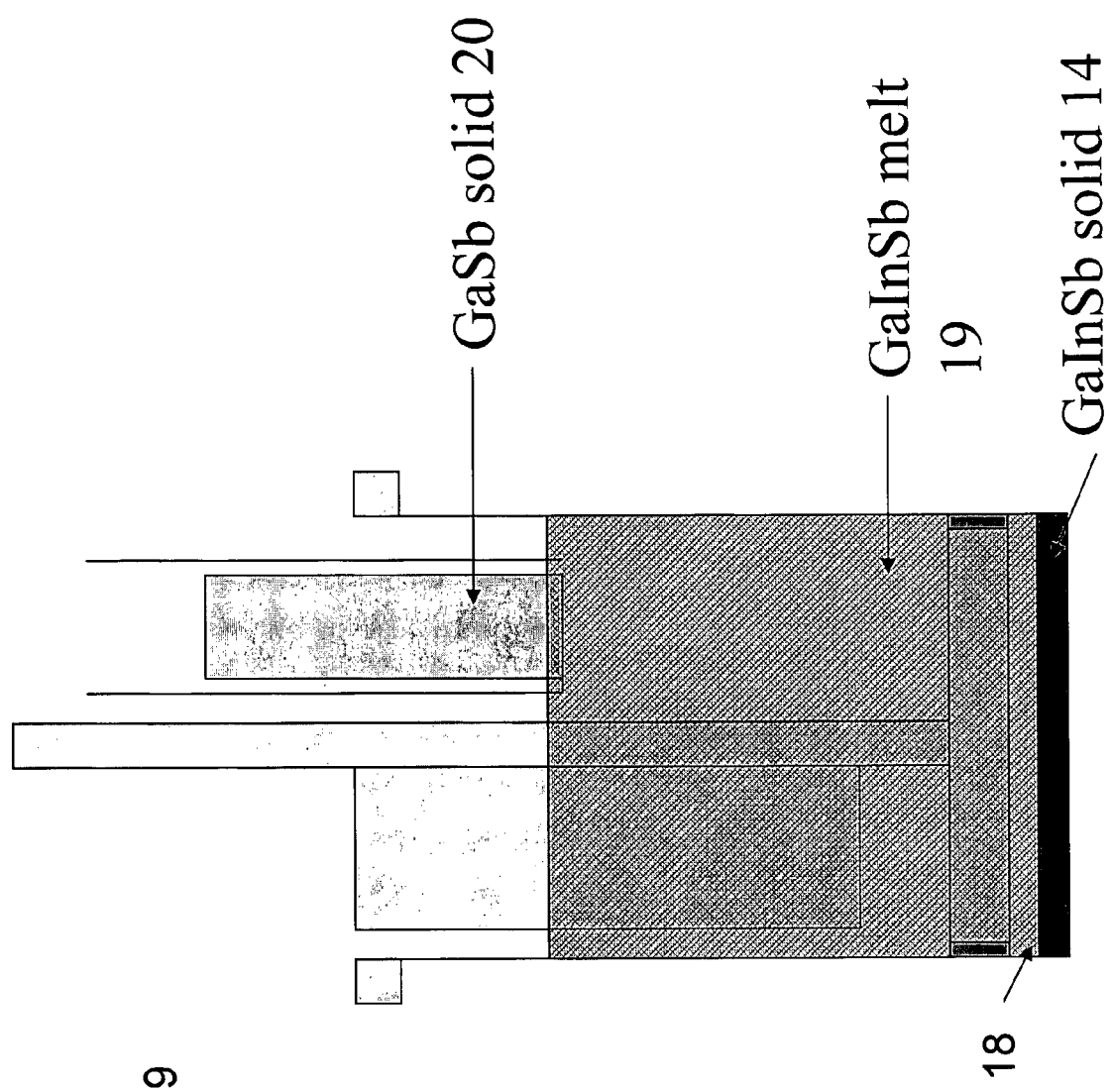

FIGS. 8 and 9 illustrate steps in a method of making a ternary "ABC" type single crystal according to one preferred embodiment of the present invention. First, as shown in FIG. 8, a ternary melt 15 comprising elements ABC is formed in the vessel 13. For example, for a GaInSb alloy, the melt comprises GaInSb. The melt 15 comprises the synthesizing melt 19 portion and the growth melt 18 portion. The melt 15 may be formed by placing polycrystalline GaSb and InSb pieces into the vessel 13 and heating the pieces above their melting temperature. The AC solute 20, such as GaSb solid solute, is located outside the vessel 13 at this point.

Then, as shown in FIG. 9, the solid solute 20 is provided into the melt 15, such as by lowering the vessel 22 containing the solute 20. The solid solute provides element A into the melt 15. Element A (i.e., Ga in a GaInSb melt) diffuses through the openings 17 in the thermal barrier 16 to the growth melt 18 to initiate ternary crystal growth on a ternary ABC crystal growth seed. In the case where the thermal barrier 16 comprises a bottom wall of an inner crucible 116 rather than a flat plate, the BC binary melt may remain in the narrow space between the inner wall of the outer crucible 13 and the outer wall of the inner crucible 116.

Optionally, dopants can be added to the melt prior to crystal growth, or dopants can be added to the mixture of the melt starting materials prior to melting the starting materials. Suitable dopants include any material which may impart desirable properties (e.g., desirable electrical properties) to the ternary or quaternary crystals, such as any material which is commonly used in conventional binary, ternary, quaternary alloys. Examples of such dopants include an n-type dopant, such as tellurium, selenium, and sulfur, and p-type dopants, such as zinc, cadmium, and the like. Preferably, the n-type or p-type dopant is used in an amount effective to make a semiconductor crystal a n-type or p-type semiconductor, respectively. Suitable amounts of these types of dopants can range from about 1 ppm to about 1000 ppm, preferably from about 10 ppm to about 100 ppm, per unit weight of the melt composition. Preferably, the dopant does not contain any element which is present in the melt's starting components.

Figure 10:
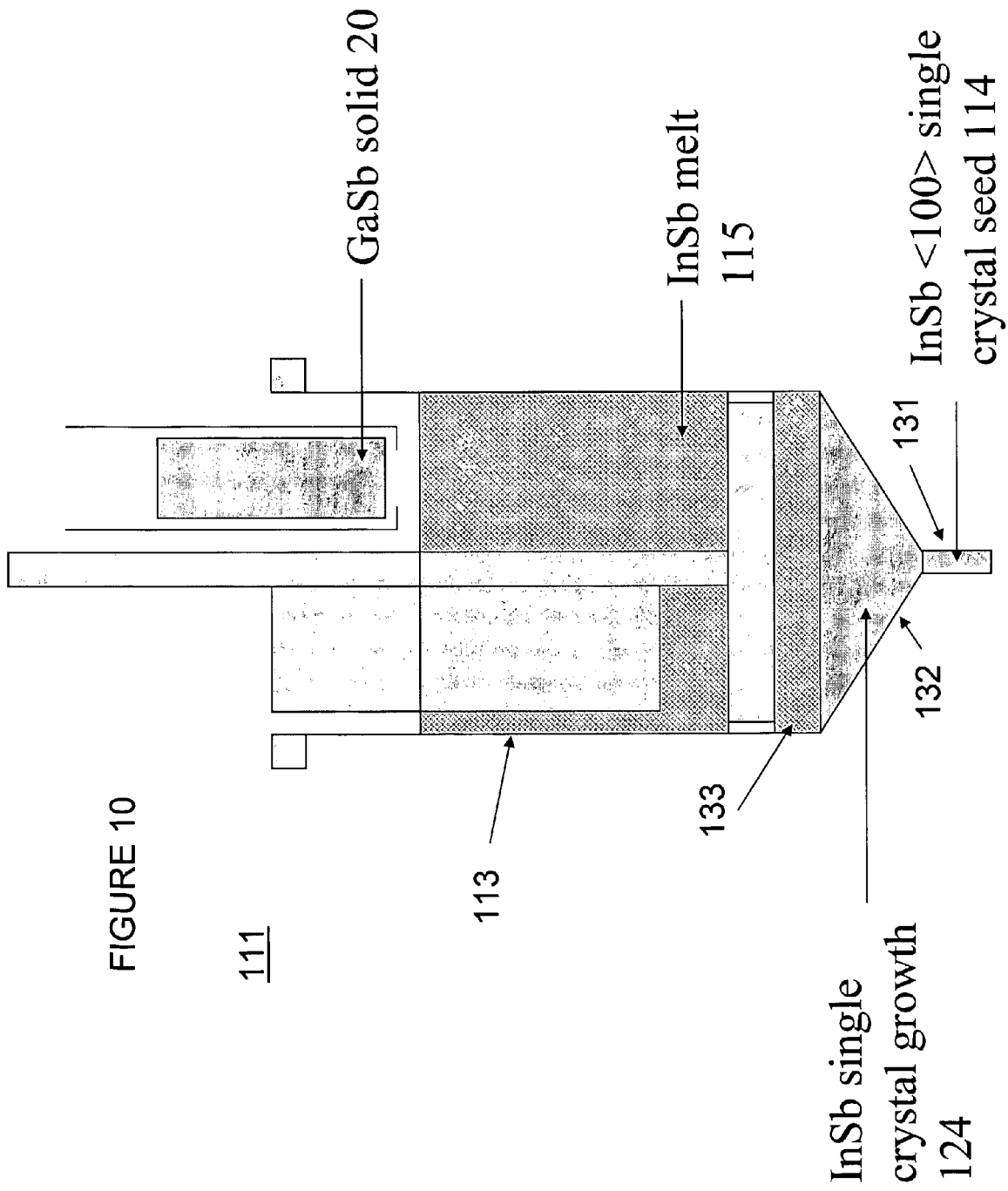
Figure 11:
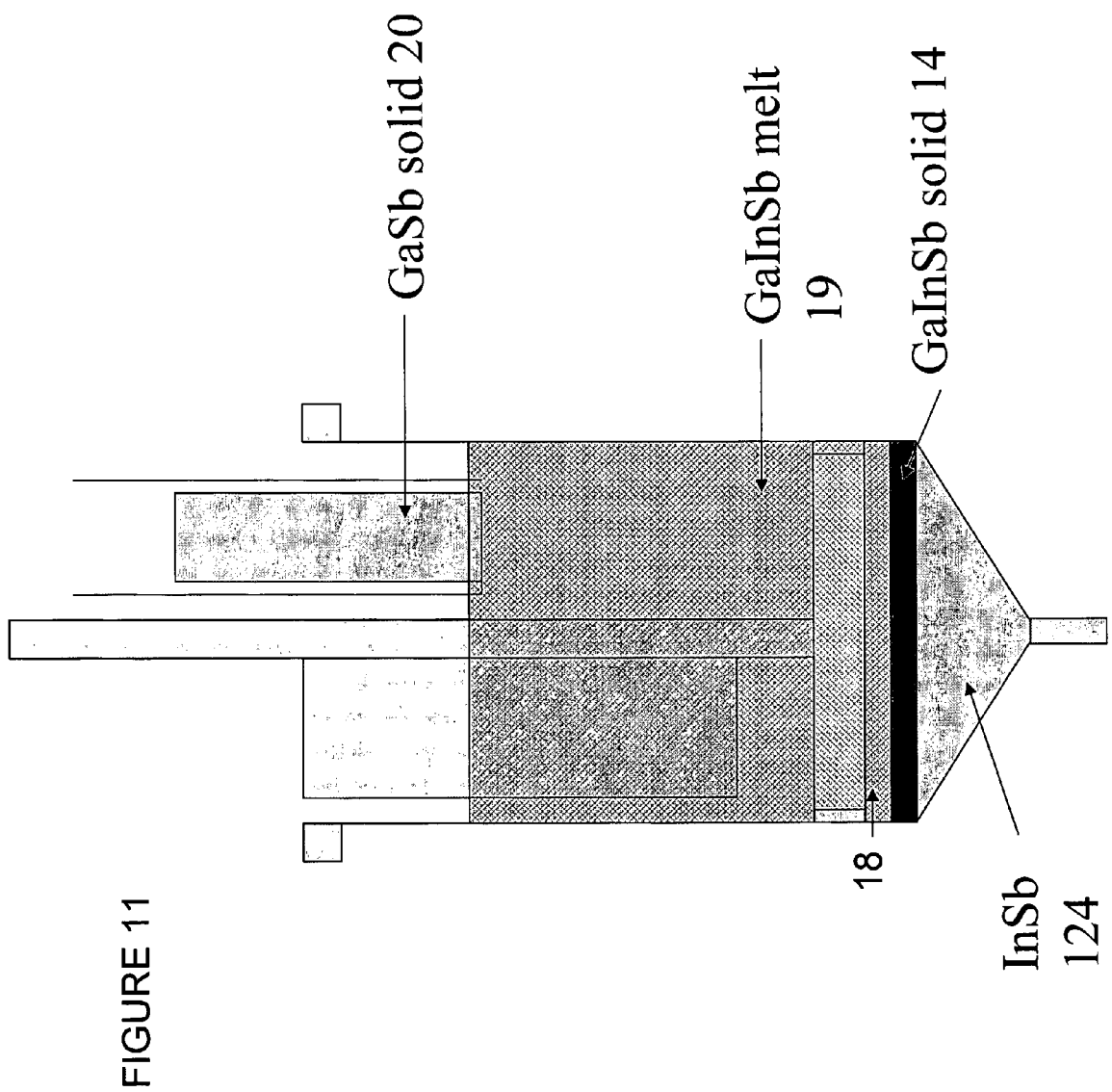

FIGS. 10 and 11 illustrate a method according to another embodiment of the present invention. In the method of FIGS. 10 and 11, a binary crystal growth seed may be used to grow a ternary or quaternary single crystal growth seed, and if desired, a further ternary or quaternary single crystal containing boule on the ternary or quaternary single crystal growth seed. As shown in FIG. 10, the apparatus 111 contains a vessel 113 having an optional narrow lower portion 131. Portion 131 may be 5 to 10 mm wide (i.e., have a diameter of 5-10 mm). A small binary single crystal growth seed 114, such as a 5-10 mm seed, is placed into the lower portion 131. Alternatively, any other size binary seed, such as a 5 to 100 mm seed, for example a 50 to 100 mm seed, may be used and the narrow portion 131 may be omitted. For example, a <100> single crystal InSb seed may be used to grow a GaInSb seed and single crystal. The vessel 113 also preferably contains a sloped portion 132 connecting the narrow lower portion 131 to a wider upper portion 133. The upper portion 133 may have a width or diameter which corresponds to the width or diameter of the boule to be grown. For example, portion 133 may have a width of 50 to 100 mm. The other parts of the apparatus 111 and vessel 113 are the same as those of apparatus 11 and vessel 13 described previously.

As also shown in FIG. 10, the vessel 113 is filled with a binary melt 115. For growing an ABC type ternary seed and/or crystal, the binary melt comprises an BC melt, as described with respect to the previous embodiments. Then, a BC type binary single crystal seed 124, such as an InSb seed, is grown in the sloped portion 132 of the vessel 113.

Then, after the grown binary seed 124 fills the entire sloped portion 132, the AC type solid solute 20, such as GaSb, is provided into the binary melt 115 to form a ternary melt ABC, such as GaInSb. The ternary melt 115 is provided with a low concentration of the solute to form a graded composition ternary seed 14 located on the binary seed 124. The ternary seed has a variable or graded axial composition $A_{1-x}B_xC$, where x decreases with increasing seed height. After the ternary seed reaches a desired composition (i.e., a desired value of x), a ternary single crystal boule having the same axial composition is grown on the seed. Alternatively, the seed 14 is removed from vessel 113 and sliced or cut, and the cut portions of the seed 14 are reused in later crystal growth runs.

The method of growing the ternary seed from the binary seed is preferably the same as the method of growing a ternary crystal, except for the following. Preferably, the vessel 113 rotates about its axis, but is not moved down during seed growth. However, the thermal barrier 16 is moved up to accommodate the growing seed. Once the seed growth is completed, the vessel 113 is moved down during crystal growth while the thermal barrier 16 remains stationary.

The single crystal made by the method of the preferred embodiments of the present invention is preferably located in a boule. In other words, at least a portion of the boule comprises a single crystal. An upper portion of the boule that solidifies last may contain a polycrystalline region. The boule is preferably, but not necessarily cylindrical in shape. Preferably, the single crystal boule diameter (i.e., width or radial dimension) is at least 50 mm, such as 50 to 100 mm. Larger diameter boules may also be formed. Preferably, the single crystal growth rate is 2 to 5 mm/hr, such as 3 to 4 mm/hr for a single crystal having a diameter of at least 50 mm. The boule preferably has a length (i.e., axial dimension) of at least 50 mm, such as 50 to 200 mm.

The ternary or quaternary single-crystal composition or alloy has the formula $A_xB_{1-x}C_yD_{1-y}$ where x and y are the same or different and are in the range of 0 to 1, such as between 0.1 and 0.9, but where both x and y do not equal to zero or one. Preferably, the single-crystal has a volume of greater than about 1 cm$^3$, such as greater than 2 cm$^3$, such as greater than about 5 cm$^3$, such as greater than about 10 cm$^3$, such as greater than about 20 cm$^3$, such as greater than about 30 cm$^3$, such as greater than about 40 cm$^3$. In addition, the single crystal is preferably substantially free from crystal defects. The crystal is considered to be "substantially free from crystal defects" when it has fewer than about 10$^6$ crystal defects (e.g., cracks, inclusions, precipitates, dendrites, and/or dislocations) per cm$^2$, such as when it has fewer than 10$^5$ crystal defects per cm$^2$, such as when it has fewer than 10$^4$ crystal defects per cm$^2$, such as when it has fewer than 10$^3$ crystal defects per cm$^2$, such as when it has fewer than 100 crystal defects per cm$^2$. The dislocation may be measured using an etch pit density method and the other defects, such as dendrites or inclusions may be measured by chemical etching using various acid-base mixtures.

Preferably, at least a portion of a ternary single crystal boule, such as a cross sectional slice having an axial length of 0.5 to 2 mm, has a diameter of at least 50 mm, a defect density, such as a dislocation density, of less than 100 cm$^{-2}$, and a radial compositional variation of less than 1%. For example, a cross sectional slice having an axial length of 0.5 to 1 mm, has a diameter of 50 to 100 mm, a dislocation density of 50 to 100 cm$^{-2}$, and a radial compositional variation of 0.5 to 1%, such as 0.2 to 1%.

In other words, the boules have radially uniform compositions and axially uniform compositions over at least part of their length (i.e., in the growth direction). From such boules, one can readily produce homogeneous single-crystal alloy boules having radially and axially uniform compositions by slicing the boule (generally in a direction perpendicular to the growth direction) to sever the compositionally uniform portion from the seed crystal and from any compositionally non-uniform portions.

Furthermore, the finished boule is preferably cut or sliced by any suitable technique to form one or more single crystal wafers. For example, the wafer may have a thickness of less than 1 mm, a diameter of at least 50 mm, a dislocation density of less than 100 cm$^{-2}$ and a radial compositional variation of less than 1%. For example, a 0.5 to 0.7 mm thick wafer preferably has a diameter of 50 to 100 mm, a dislocation density of 50 to 100 cm$^{-2}$, and a radial compositional variation of less than 0.5 to 1%.

A solid state device is then formed on the wafer. If the wafer comprises a semiconductor wafer, such as a GaInSb or GaInAs wafer, then preferably a semiconductor device is formed on this wafer. The semiconductor device may comprise a photovoltaic device, such as a solar cell (including multi-junction solar cell) or a photodetector, a light emitting device, such as a laser or a LED, an electronic device, such as a transistor or another solid state device. If the wafer comprises a ceramic wafer, such as a lithium niobate wafer, then a solid state device, such as a SAW device or an optical modulator device, may be formed on the wafer. Other ternary and quaternary ceramic and semiconductor boules and wafers may also be formed.

Other devices and layers may also be formed on the wafer. For example, they include thermophotovoltaic ("TPV") devices for generation of electricity, high frequency devices, detectors for monitoring environmental pollution, trace chemicals, and toxic or other types of gases, for example, in industrial environments and in fire detection devices. By altering the relative amounts of the elements present in the ternary and quaternary alloys, the band gap can be tuned for a particular application.

The ternary and quaternary alloys can also be used as substrates for other alloys. For example, using a $Ga_xIn_{1-x}Sb$ ternary alloy as a substrate, one can grow another alloy layer (e.g., $InAs_ySb_{1-y}$) thereon. The alloy layer (e.g., $InAs_ySb_{1-y}$) will also be substantially free from crystal defects. In contrast, when one uses prior art methods of first growing $Ga_xIn_{1-x}Sb$ on a binary (e.g., GaSb) substrate and then growing a layer of $InAs_ySb_{1-y}$ on the resulting composition to form an $InAs_ySb_{1-y}/Ga_xIn_{1-x}Sb/GaSb$ structure, the $InAs_ySb_{1-y}$ is not substantially free from crystal defects. It is believed that the failure to produce $InAs_ySb_{1-y}/Ga_xIn_{1-x}Sb/GaSb$ structures having a $InAs_ySb_{1-y}$ that is free from crystal defects is caused by defects in the $Ga_xIn_{1-x}Sb$ layer of the $Ga_xIn_{1-x}Sb/GaSb$ composition on which the $InAs_ySb_{1-y}$ is grown. By being able to provide a ternary (e.g., $Ga_xIn_{1-x}Sb$) alloy substantially free from crystal defects, the need to use $Ga_xIn_{1-x}Sb/GaSb$ is eliminated. Furthermore, high quality $Ga_xIn_{1-x}Sb/GaSb$ compositions in which x is greater than about 0.1 are cannot be made using the methods of the prior art because growing $Ga_xIn_{1-x}Sb$ (in which x>0.1) on GaSb results is so many crystal defects that the $Ga_xIn_{1-x}Sb$ is subject to mechanical failure. In contrast, using the methods of the preferred embodiments of the present invention, there is no need for a binary substrate and $Ga_xIn_{1-x}Sb$ having x greater than 0.1 can be produced. As one skilled in the art will appreciate, by increasing the value of x in $Ga_xIn_{1-x}Sb$, one can shift the emission wavelength of infrared lasers to longer wavelengths.

Thus, an infrared laser which employs a $Ga_xIn_{1-x}Sb$ alloy having, for example x greater than about 0.1, such as greater than 0.15, such as greater than about 0.2, may be provided. The $Ga_xIn_{1-x}Sb$ alloy can also include one or more dopants. For example, the $Ga_xIn_{1-x}Sb$ alloy can be uniformly doped throughout with Te. The Te-doped $Ga_xIn_{1-x}Sb$ alloy can also be doped with zinc, preferably in a near-surface region so as to create a p-n junction. This near-surface doping with zinc can be carried out using standard doping techniques, such as by exposing the surface of the Te-doped $Ga_xIn_{1-x}Sb$ alloy to zinc vapor.

Thus, the methods of the preferred embodiments of the present invention provide multi-component single crystals with a high yield and at a low cost. These crystals are substantially or completely crack and inclusion free. The crystals have a low dislocation density and low strain. The crystals may be formed into compositionally homogeneous, large diameter wafers. The following elements and features of the method and apparatus of the preferred embodiments of the present invention are believed to provide each of the above described advantages.

Crack-free single crystals are achieved by avoiding constitutional supercooling. This means that crystal growth rate is lower than the rate at which excess constituents rejected at the melt-crystal interface (due to segregation) are mixed back into the growth melt. This is achieved by forced convective mixing, such as by ACRT, in the growth melt 18 near the melt-crystal interface.

Inclusion free crystals are achieved if the growth melt 18 is kept homogeneous at all times. This is also achieved by forced convective mixing, such as by ACRT, in the growth melt 18 near the melt-crystal interface.

Single crystallinity is maintained if the rate at which nuclei precipitate near the melt-crystal interface is slower than the rate at which the crystal grows. This is provided by controlling the solute feeding to the melt-crystal interface at all times during the crystal growth. In addition, constitutional supercooling should be avoided as described above. This is achieved by controlling the supersaturation level in the growth melt 18 to be close to that required for equilibrium growth, as well as by forced convective mixing, such as by ACRT, in the growth melt 18 near the melt-crystal interface.

Low dislocation density and strain can be achieved if the growth takes place under a low temperature gradient. This is achieved by a small temperature gradient near the melt-crystal interface, such as a temperature gradient of less than 1 degree Celsius in the growth melt 18, and by cooling the crystals in a low gradient after solidification.

High yield refers to obtaining wafers of the same composition from a single ingot or boule. This is achieved when the crystal has same composition along the axial or growth direction by replenishment of the melt with the melt constituents (i.e., by providing the solute 20 into the synthesizing melt 19) to maintain the same melt composition during the entire growth. At the same time, the ingot or boule should be completely single crystal in nature. Thus, the melt replenishment should be done in a controlled fashion to avoid supersaturation of the melt with the replenished constituents.

Low cost relates to the growth rate of the crystal and the volume of starting melt versus the volume of final crystal. Thus, a low cost crystal growth method consumes the entire melt during the growth and rapidly transports the dissolved constituents (replenishing elements or compounds) to the growth interface by forced convection. In addition, rapid dissolution of the replenished constituents (solute) is needed. Thus, the dissolution of the solute preferably occurs in a melt zone that is always undersaturated.

A compositionally homogeneous wafer means uniform composition in the radial direction (i.e., in the wafer plane perpendicular to the growth or axial direction). This is achieved by a planar melt-crystal interface (isotherm) during growth. This can be achieved by balancing the heat transfer at the melt-crystal interface by a combination of temperature gradient imposed by the heater and the forced convective mixing in the growth melt. At the same time, temperature fluctuations due to forced convection in the growth melt (leading to composition fluctuation and local constitutional supercooling) should eliminated. This can be achieved by having a shallow growth melt 18 with close to isothermal conditions.

Large diameter wafers are highly desirable for commercial applications. This may be achieved by the optimization of the heat and mass transport processes between various melt zones during growth for the length scales of interest. This is dictated by the design of the apparatus set-up and the process parameters. Specific examples of these parameters are provided in the specific example section below.

The apparatus and method of the preferred embodiments of the present invention contains the following preferred features or elements that provide the conditions described above.

A solute 20 feeder 22 is used to replenish the melt 15 with its constituents, which may be used to keep the composition of the growth melt 18 uniform with time for growth of crystals with a uniform axial (i.e., non-graded) composition. The synthesizing melt 19 composition changes with time for uniform and non-uniform (i.e., graded) axial composition crystals. The solute feeder 22 is preferably dipped into the synthesizing melt 19 periodically to avoid melt supersaturation by excessive dissolution of the solute and thereby precipitation in the regions anywhere else in the melt 15 except at the melt-crystal interface. The amount of solute 20 present in the melt 15 at any time is such that it can lead to supersaturation and growth (by precipitation of nuclei) only at a temperature corresponding to the growth melt 18 crystal interface temperature.

The synthesizing melt 19 is always kept well below the solubility limit of the solute 20 in the solvent (melt). This is desirable to ensure that whenever the solute 20 is dipped in the synthesizing melt 19, it dissolves rapidly. Therefore, a large temperature gradient, such as a gradient of at least 20° C., is maintained between the top of the synthesizing melt 19 and the bottom of the synthesizing melt 19. Since the solubility of the solute 20 increases with temperature, the region where the solute 20 dissolution occurs should be at a higher temperature than other regions of the melt. At the same time, the solute feeder 22 is preferably dipped into the synthesizing melt 19 periodically to avoid melt supersaturation by excessive dissolution of the solute and thereby precipitation in the regions anywhere else in the melt 15 except at the melt-crystal interface at all times.

Mixing the synthesizing melt 19 by forced convection allows rapid transport of the dissolved solute 20 to the growth melt-crystal growth interface. This allows the process to maintain a high growth rate.

Since there is a temperature gradient between the synthesizing melt 19 region where the solute 20 is dissolved and the growth interface, any forced convection used for transporting solute may thermally destabilize the growth interface and lead to constitutional supercooling by rapid dissolution and re-growth of interfaces. Therefore, the thermal barrier or separator 16 is provided between the growth melt 18 and the synthesizing melt 19 to reduce or eliminate this effect.

The synthesizing melt 19 should always be richer in solute 20 content than the growth melt 18 (due to segregation). The transport of solute 20 between the two melts 18, 19 maintains a uniform crystal composition. Since one needs to avoid heat transfer between the synthesizing 19 and growth 18 melt areas while transporting solute, there should not be any forced convection in the opening or channel 17 between the two melts 18, 19. Provided that the thermal barrier 16 is not moved vertically by 1-2 mm as described above, solute diffusion should be the only mechanism in the opening or channel 17 between the two melts 18, 19. Hence, the thickness of the thermal barrier 16 separating the two melts 18, 19 should be relatively small, such that while heat transfer is avoided, mass transport by diffusion takes less time.

The growth melt should be mixed by forced convection so that the rejected species at the growth interface (due to segregation) mix back into the growth melt and are used in absorbing the solute fed from the synthesizing melt. Forced convection is also desirable to achieve a planar melt-crystal isotherm (interface) useful for uniform alloy composition on the wafer plane. ACRT is very effective in achieving both of these conditions.

There should not be any significant temperature fluctuation in the growth melt 18. This can be enforced by having a shallow growth melt such that the temperature gradient between the top and the bottom of the melt is very small, such as less than one degree Celsius. A "near isothermal" growth melt is desirable since a temperature difference is needed to create supersaturation at the melt-crystal interface for actual crystal growth.

Thus, the crystal growth method described above enables high growth rates for single crystals with uniform composition. The solute dissolution is controlled such that supersaturation can occur only at the growth interface. The nature of forced convection in the synthesizing melt 19 (by stirrer 25) and in the growth melt (by ACRT) ensures rapid transport of dissolved species to the growth interface. The thermal instability at the growth interface due to forced convection is avoided by having a thermal barrier 16 between two melt areas 18, 19.

Ternary semiconductor alloys or compositions which can be produced using the method of the preferred embodiments of present invention include those having the formula ABC, where A and B are Group III elements and C is a Group V element; where A is a Group III element and B and C are Group V elements; where A and B are Group II elements and C is a Group VI element; or where A is a Group II element and B and C are Group VI elements. Examples of such ternary compounds include GaInAs, GaInSb, GaInP, AlGaAs, AlGaSb, AlGaP, AlInAs, AlInSb, AlInP, InAsSb, InAsP, InSbP, GaAsSb, GaAsP, GaSbP, AlAsSb, AlAsP, AlSbP, ZnTeSe, ZnTeS, ZnSeS, CdTeSe, CdTeS, CdSeS, HgTeSe, HgTeS, HgSeS, ZnCdTe, ZnCdSe, ZnCdS, ZnHgTe, ZnHgSe, ZnHgS, CdHgTe, CdHgSe, and CdHgS. Furthermore, ceramic ternary compositions, such as lithium niobate, rare earth garnets, such as YAG, and other ceramic scintillators, such as bismuth germanate ("BGO") and lutetium oxyorthosilicate ("LSO"), may be provided.

Quaternary semiconductor alloys or compositions which can be produced using the method of the preferred embodiments of the present invention include those having the formula ABCD, where A and B are Group III elements and C and D are Group V elements or where A and B are Group II elements and C and D are Group VI elements. Examples of such ternary compounds include GaInAsSb, GaInAsP, GaInSbP, AlGaAsSb, AlGaAsP, AlGaSbP, AlInAsSb, AlInAsP, AlInSbP, ZnCdTeSe, ZnCdTeS, ZnCdSeS, HgCdTeSe, HgCdTeS, HgCdSeS, ZnHgTeSe, ZnHgTeS, and ZnHgSeS. Furthermore, ceramic quaternary compositions may also be made.

Suitable semiconductor ternary melts that can be used in the method of the preferred embodiments of the present invention include those which include two Group III elements (e.g., aluminum, gallium, and indium) and one Group V element (e.g., phosphorus, arsenic, and antimony); those which include two Group V elements and one Group III element; those which include two Group II elements (e.g., zinc, cadmium, and mercury) and one Group VI element (e.g., sulfur, selenium, and tellurium); and those which include two Group VI elements and one Group II element.

The materials used to form the melt can vaporize at the high temperatures typically used to form the melt and/or at which the crystal is grown. In such situations, it can be advantageous to encapsulate the melt. This technique is commonly referred to as liquid encapsulation. Briefly, an encapsulant is layered over the melt materials, either before or after the melt is formed. The encapsulant, having a melting point significantly lower than the melt, melts and forms a liquid layer on the surface of the melt. This liquid layer prevents evaporation of the melt materials and, thereby, prevents unexpected changes to the composition of the crystal. Suitable encapsulants include boric oxide ($B_2O_3$) glass and various low vapor pressure salts, such as metal halide salts, combinations of two or more alkali metal halide salts (e.g., LiCl/KCl and NaCl/KCl), or combinations of alkali metal salts and alkaline earth metal halide salts (e.g., $NaCl/CaCl_2$). The salts may be removed from the grown crystal by placing the encapsulated grown crystal into hot water to dissolve the salts.

The following specific examples are provided for illustration only and should not be considered limiting on the scope of the invention.

EXAMPLE 1

A commercial InSb <100> oriented seed of 5 mm in diameter and 3 cm in length was inserted into a quartz (silica) crucible designed to grow single crystals using a vertical Bridgman technique. The crucible was filled with InSb polycrystals and LiCl—KCl alkali halide salt for melt encapsulation and coating the crucible walls. The crucible was placed in the crystal growth chamber along with other components such as solute feeder and stirrer-thermal barrier plate structure. The solute feeder basket was filled with a polycrystalline GaSb rod. The crucible with InSb as well as the other solute feeder basket and other components were placed outside the heater zone of the furnace.

The growth chamber was evacuated to 1 millitorr of vacuum and flushed with inert gas such as argon or hydrogen several times before filling the chamber with the inert gas. In this example, argon was used as the inert gas and a pressure of approximately 1.2 atmosphere was used during the entire growth.

The furnace was heated to a maximum temperature of 625° C. The temperature gradient of the furnace around 525° C. was 15° C./cm and was approximately 5° C./cm close to 600° C. The actual temperature gradient in the melt (in the latter case) was approximately 2° C./cm due to heat conduction.

After the furnace temperature stabilized, the crucible was slowly raised into the furnace such that the entire crucible was heated to at least 400° C. enabling the salt to melt and coat the entire crucible wall. The crucible was then raised slowly until the InSb polycrystals melted and filled the space in the crucible above the seed. The crucible was then slowly raised by 1-2 mm to remelt the InSb single crystal seed to promote single crystal growth.

The crucible was then rotated in an accelerated crucible rotation (ACRT) fashion. The ACRT scheme comprised of accelerating the crucible rotation from 10 rpm to 75 rpm in 30 seconds followed by a de-acceleration from 75 rpm to 10 rpm in 30 seconds. The crucible rotation was unidirectional.

To grow the InSb single crystal, the crucible was lowered into the cold zone of the furnace at a rate of 3 mm/hr. InSb was grown in the conical region of the crucible (~3 cm in height) from the seed. After this the crucible lowering was stopped and the crucible was held stationary in a temperature gradient zone of the furnace. The stirrer along with the thermal barrier structure was lowered into the melt and left stationary at a position approximately 0.5 cm from the crystal interface. The melt height of InSb was approximately 6-7 cm when the structure was dipped in the melt.

The solute feeding basket with the GaSb polycrystal was then dipped in the top of the melt. The solute feeder was dipped for 1 minute every 30 minutes. After the dipping, the basket was raised few mm away from the melt surface. The crucible kept rotating with the ACRT scheme mentioned above while the stirrer with the thermal barrier plate structure remained stationary in the melt. Then the stirrer-thermal plate structure was raised from the crystal interface at a rate of 3 mm/hr while the crystal grew. The crucible was kept stationary during this growth period. The solute feeder basket was also raised with the same rate as the stirrer-thermal plate structure.

During the entire period, a compositionally graded GaInSb was grown starting from a InSb composition and with increasing gallium content. After the crystal grew for 2.5 to 3 cm, the composition of the solid had approximately 45 mol % GaSb and 55 mol % in Sb.

Then, the crucible was started lowering at a rate of 3 mm/hr while the stirrer-thermal plate structure was left stationary at approximately 0.5 mm from the crystal interface. The solute feeding was continued as before. An approximately 1 cm length of the crystal with constant composition of approximately $Ga_{0.45}In_{0.55}Sb$ was grown. At the end of this period, the solute feeder was kept separated from the melt and the stirrer along with the thermal plate was removed the melt. The remaining melt was solidified by cooling the furnace at a rate of 2° C./hr until 500° C. and then to room temperature over a period of 50 hours.

The crystal was removed from the salt by dissolving the salt in hot water. The crystal was sliced along the growth direction along the central core of the crystal. Wafers were also sliced perpendicular to the growth direction. The wafers were 0.5-0.7 mm thick. They were lapped and polished to mirror shining on both sides. Electron microprobe x-ray analysis was used to study the spatial alloy composition of the slices. Fourier transform infrared measurements were used to evaluate the spatial alloy bandgap of the slices.

Figure 12:
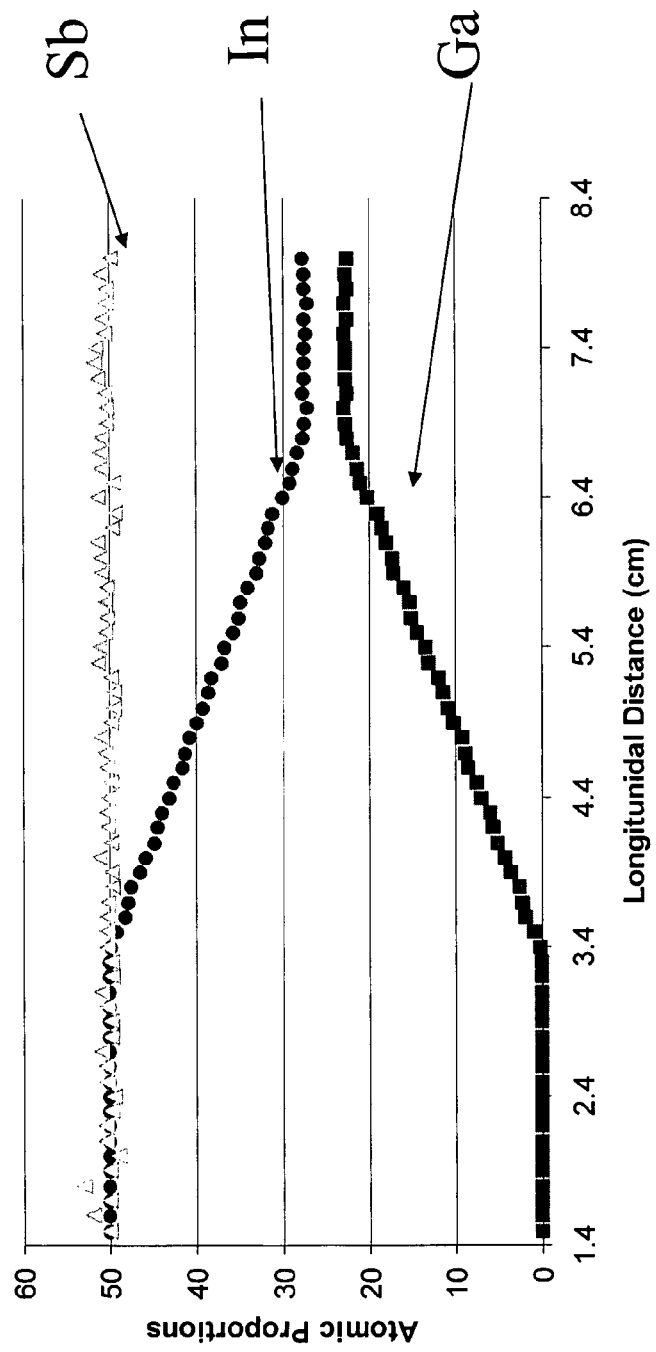
FIG. 12 is a plot of concentration versus axial position for a boule according to example 1.

FIG. 12 shows the axial composition profile of the graded GaInSb crystal from the InSb binary seed. During the formation of the crystal, for the portion of the crystal from 1.3 to 3.4 cm, the thermal barrier 16 was in the same horizontal plane and the vessel 13 was lowered. For the portion of the crystal from 3.4 cm to about 7 cm, the thermal barrier 16 was raised while the vessel 13 remained in the same horizontal plate to achieve a graded axial composition. For the portion of the crystal from about 7 cm to about 8 cm, the thermal barrier remained in the same horizontal plane while the vessel 13 was lowered to achieve a uniform axial composition.

Figure 13:
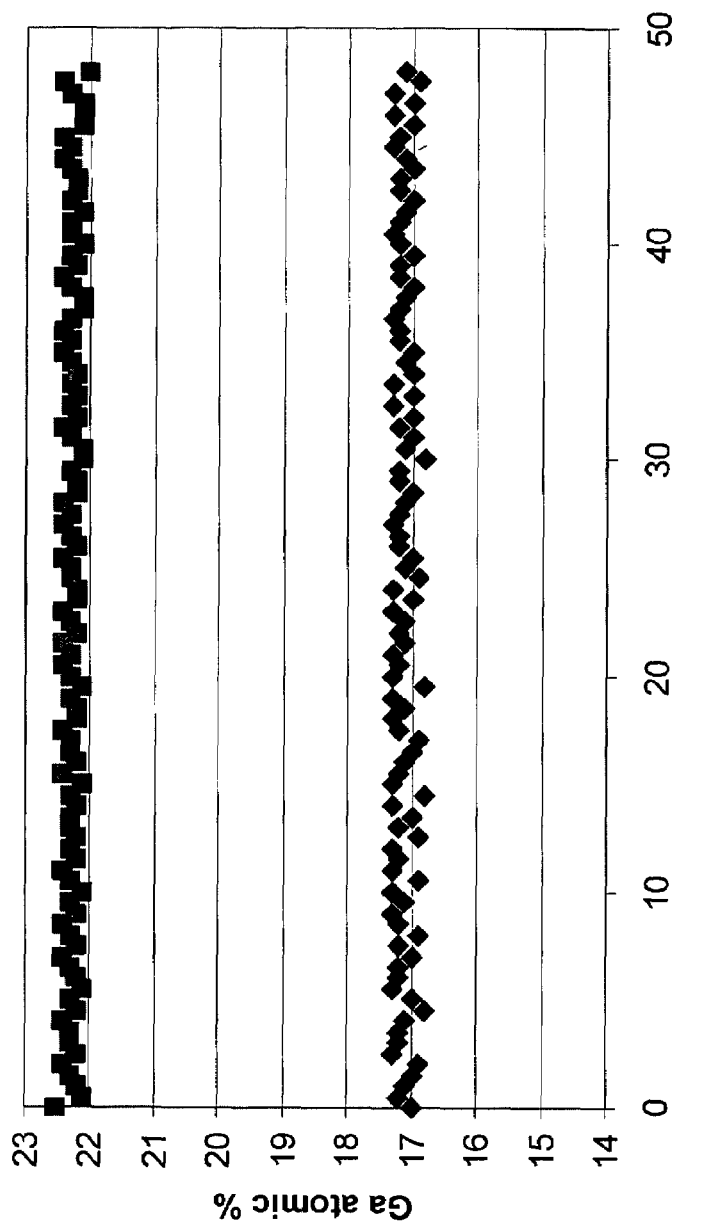
FIGS. 13-16 are plots of concentration versus radial position for wafers according to examples 1-4 respectively.

FIG. 13 shows the radial gallium profiles of two GaInSb wafers. No cracks were seen in crystal grown using this method. The radial compositional variation of Ga in these wafers was less than 1% (i.e., about 0.5%), as shown in FIG. 13. In contrast, to grow crack free crystals using conventional vertical Bridgman, the growth rate for these compositions would in the range of 0.1-0.4 mm/hr. The preferred embodiments of the present invention enables the growth of high quality crystals at approximately 3-4 mm/hr.

EXAMPLE 2

Figure 14:
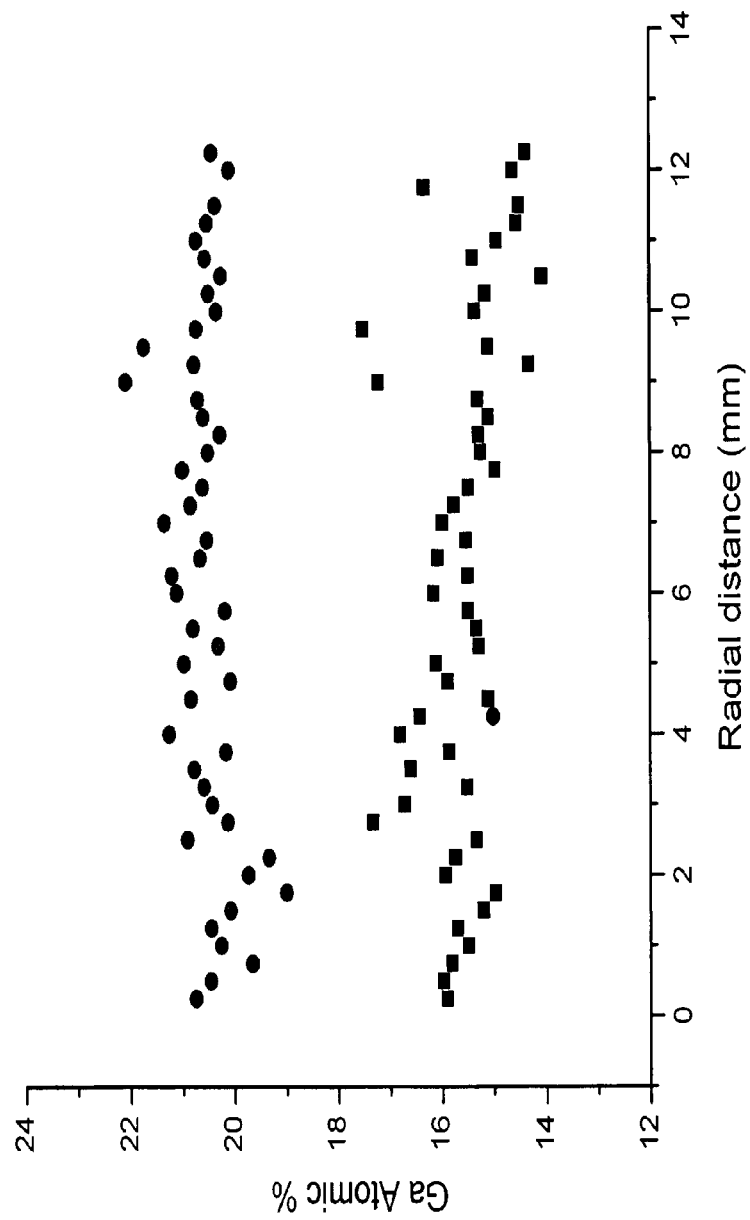

In example 2, a similar growth configuration was used to example 1, except that temperature gradient in the growth melt was twice of that in example 1. This is due to higher set-point (maximum) temperature being 680° C. instead of 625° C. As shown in FIG. 14, the radial gallium composition fluctuates more than in example 1.

COMPARATIVE EXAMPLE 3

Figure 15:
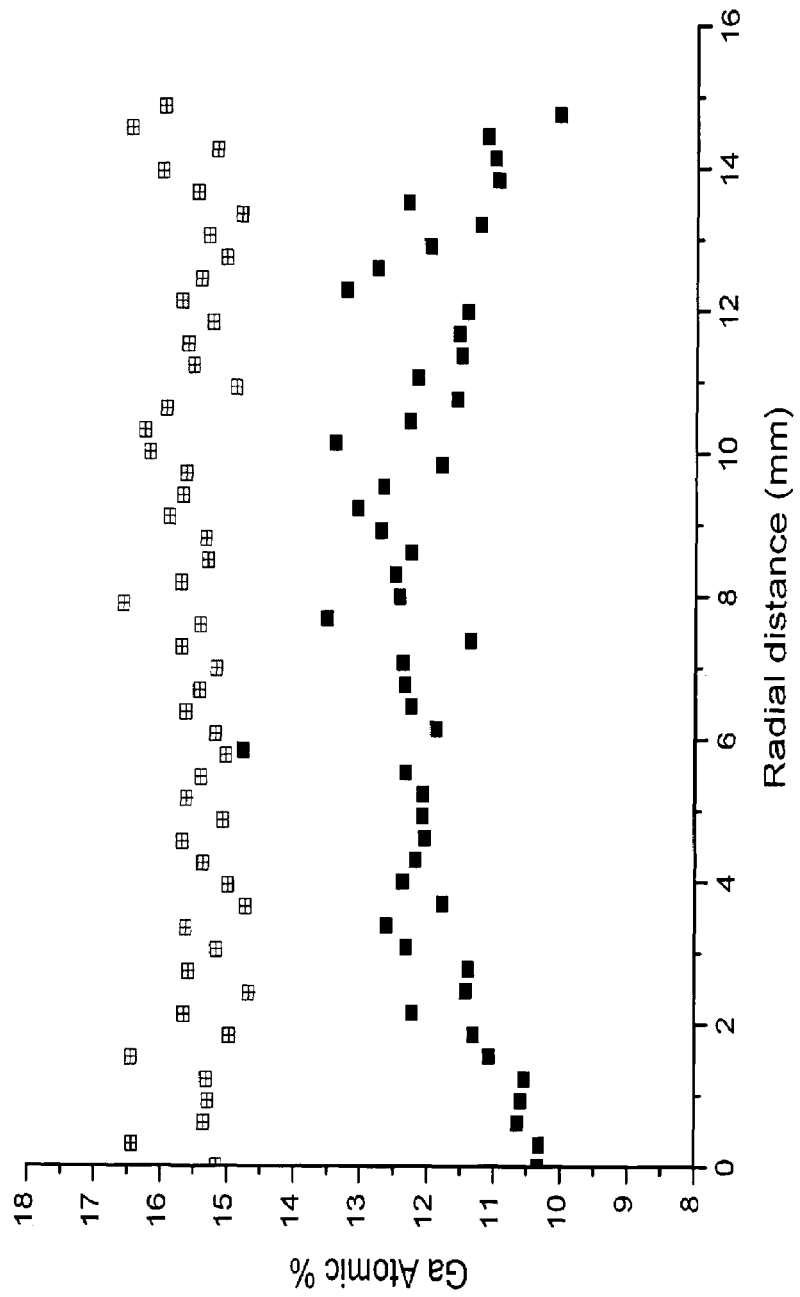

The differences between this example and example 1 are: (a) no thermal barrier plate was used in this example and (b) temperature gradient in the growth melt was more than twice of that in example 1. This is due to higher set-point (maximum) temperature being 710° C. instead of 625° C. As shown in FIG. 15, the radial gallium composition fluctuates significantly. Furthermore the melt-crystal interface is curved giving rise to a non planar gallium profile.

EXAMPLE 4

Figure 16:
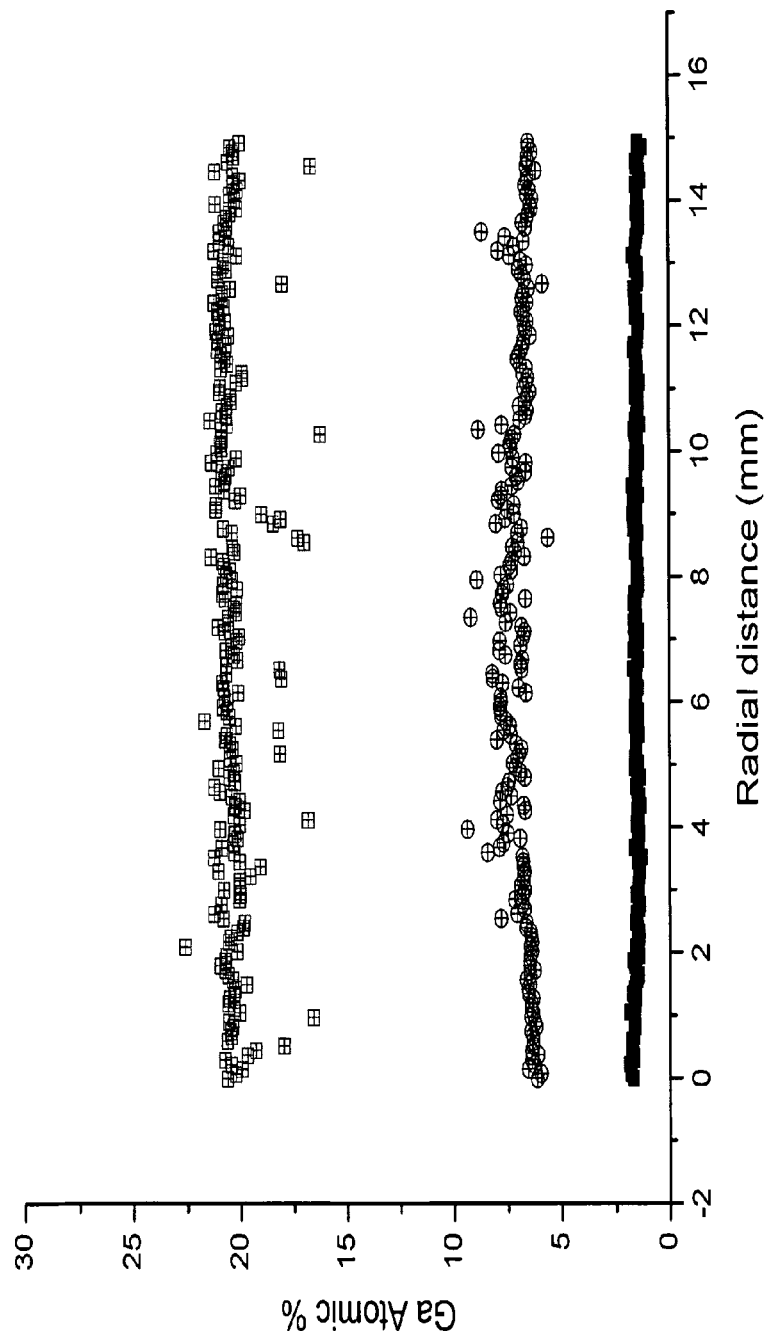

In example 4, a similar growth configuration was used to example 1, except that there was no ACRT mixing of the growth melt. The temperature gradient was exactly the same as in example 1. As shown in FIG. 16, the radial gallium profile is significantly flat except for few discrete locations where it is believed that inclusions were located due to non-mixing of the growth melt.

Examples 5-7 illustrate methods of forming boules containing regions, such as about 0.5 to about 50 micron thick regions, with different characteristics stacked in the axial direction of the boule by using plural solute feeder vessels 120 containing solutes with different characteristics.

EXAMPLE 5

Multiple liquid solute feeder vessels 120 shown in FIGS. 7E and 7F were used to grow a boule with a p-n junction and different doping concentration regions. A p-type GaSb melt (doped with zinc to $8\times10^{17}$ cm$^{-3}$) was placed in the first solute feeder 120, an n-type GaSb melt (doped with tellurium to $1\times10^{18}$ cm$^{-3}$) was placed in the second solute feeder 120, a heavily doped p-type GaSb melt (doped with zinc to $5\times10^{18}$ cm$^{-3}$) was placed in the third feeder 120, and a heavily doped n-type GaSb melt (doped with tellurium to $7\times10^{18}$ cm$^{-3}$) was placed in the fourth feeder 120. The liquids were dispensed sequentially one at a time into the synthesizing melt 19 and multiple axial region growth was carried out by lowering the crucible in the cold zone of the furnace. The final structure consisted of $p^+$-p-n-$n^+$ structure with the sequence repeated several times to make a series interconnected photovoltaic device. Thus, the final boule included regions of different type (different doping type and different dopant concentration type). These types of structures with the same semiconductor compound and with different sequence of doped regions could be grown by this method for a variety of applications including electronic, optoelectronic, photovoltaic, power devices, etc.

EXAMPLE 6

Multiple liquid solute feeder vessels 120 shown in FIGS. 7E and 7F were used to grow a boule with different semiconductor material type regions. A p-type AlGaSb melt (doped with zinc to $5\times10^{17}$ cm$^{-3}$) was placed in the first solute feeder 120 and an n-type GaSb melt (doped with tellurium to $8\times10^{17}$ cm$^{-3}$) was placed in the second feeder 120. The liquids were dispensed sequentially one at a time and multiple axial region growth was carried out by lowering the crucible in the cold zone of the furnace. The final structure consisted of p-n AlGaSb/GaSb structure to make an infrared photodetector operating at 1.8 μm cut-off wavelength. These types of structures with the different semiconductor compounds with different sequence of doped regions could be grown by this method for a variety of applications including electronic, optoelectronic, photovoltaic, power devices, etc.

EXAMPLE 7

Multiple liquid solute feeder vessels 120 shown in FIGS. 7E and 7F were used to grow a boule with different relative element concentration type regions. In this example, a $Ga_{1-x}In_xSb$ (0<x<1) boule of different x in each axial region is grown. Unintentionally doped p-type $Ga_{0.6}In_{0.4}Sb$ regions were grown on unintentionally doped n-type $Ga_{0.45}In_{0.55}Sb$ regions to make a thermophotovoltaic cell. In this structure, the corresponding melts in the solute feeder vessels 120 are not doped with any impurities. The p- and n-type doping in the final layers takes place as a result of native defects which are electrically active. It is well known that $Ga_{1-x}In_xSb$ is p-type for x<0.5 and n-type for x>0.5 without any dopants [see references in P. S. Dutta, H. L. Bhat and Vikram Kumar, *The Physics and Technology of Gallium Antimonide. an Emerging Optoelectronic Material, Applied Physics Reviews, J. Appl. Phys.* 81, 5821-5870 (1997)]. These types of structures with the different semiconductor compounds with different sequence of unintentionally doped regions could be grown by this method for a variety of applications including electronic, optoelectronic, photovoltaic, power devices, etc.

Although the invention has been described in detail for the purpose of illustration, it is understood that such detail is solely for that purpose, and variations can be made therein by those skilled in the art without departing from the spirit and scope of the invention which is defined by the following claims. U.S. Pat. No. 6,613,162 is incorporated herein by reference in its entirety.

The invention claimed is:

1. A method of growing a multi-component single crystal having three or more elements, comprising:
   providing a vessel comprising a crystal growth seed located in a crystal growth area of the vessel and a thermal barrier separating the crystal growth area from a synthesizing melt area of the vessel, wherein the synthesizing melt area of the vessel comprises an area above the crystal growth area of the vessel such that at least one opening connects the crystal growth area to the synthesizing melt area;
   forming a growth melt in the crystal growth area of the vessel and a synthesizing melt in the synthesizing melt area of the vessel;
   providing a solute into the synthesizing melt, such that solute diffuses from the synthesizing melt into the growth melt through the at least one opening; and
   growing the multi-component single crystal having three or more elements on the crystal growth seed.

2. The method of claim 1, wherein:
   a temperature difference between the thermal barrier and a crystal growth surface over the crystal growth seed is 1° C. or less; and a temperature difference between the thermal barrier and a location in the synthesizing melt where the solute is provided is 20° C. or more.

3. The method of claim 2, wherein the step of providing a solute into the synthesizing melt comprises providing a solid solute into the synthesizing melt.

4. The method of claim 3, further comprising:
mixing the synthesizing melt using a first mixing step; and
mixing the growth melt using a second mixing step different than the first mixing step.

5. The method of claim 4, wherein:
the first mixing step comprises mixing the synthesizing melt using a stirrer located in the synthesizing melt during the crystal growth method; and
the second mixing step comprises rotating the vessel using an ACRT method.

6. The method of claim 4, wherein the thermal barrier substantially prevents thermal transfer between the synthesizing melt and the growth melt but allows solute transport from the synthesizing melt to the growth melt by solute diffusion through the at least one opening.

7. The method of claim 6, wherein the at least one opening comprises one or more openings located in the thermal barrier, one or more openings located between the thermal barrier and an internal wall of the vessel, or a plurality of openings located in the thermal barrier and between the thermal barrier and an internal wall of the vessel.

8. The method of claim 3, wherein:
the synthesizing melt comprises a first material having a first melting point; and
the solute comprises a second material having a second melting point higher than the first melting point.

9. The method of claim 8, wherein:
the crystal growth seed comprises ternary material having a compositional formula $A_{1-x}B_xC$;
the solute comprises a binary material having a compositional formula AC;
the synthesizing melt comprises a ternary material having a compositional formula $A_{1-y}B_yC$; and
the growth melt comprises a ternary material having a compositional formula $A_{1-x}B_xC$, where x>y, and further comprising raising the thermal barrier while maintaining the vessel in the same horizontal plane as the single crystal grows in size to obtain a single crystal having a substantially uniform radial composition profile and a variable axial compositional profile.

10. The method of claim 1, wherein:
the vessel is oriented vertically, such that the crystal growth seed is located on a bottom of the vessel, the synthesizing melt area is at a top of the vessel and the crystal growth area is located between the seed and the synthesizing melt area; and
the thermal barrier is located 0.5 cm or less from the upper multi-component single crystal surface during the growth of the single crystal multi-component alloy.

11. The method of claim 1, further comprising lowering the vessel while maintaining the thermal barrier in substantially the same horizontal plane as the single crystal grows in size to obtain a single crystal having a substantially uniform axial compositional profile.

12. The method of claim 1, further comprising raising the thermal barrier while maintaining the vessel in the same horizontal plane as the single crystal grows in size to obtain a single crystal having a substantially uniform radial compositional profile and a variable axial compositional profile.

13. The method of claim 1, wherein:
the vessel comprises a vertically oriented crucible; and
the thermal barrier comprises a plate made from a thermally insulating material located in the crucible.

14. The method of claim 1, wherein:
the vessel comprises a first crucible containing the crystal growth seed and the growth melt area and a second crucible containing the synthesizing melt area;
the thermal barrier comprises a bottom wall of a second crucible containing the at least one opening;
the second crucible is located at least partially in the first crucible.

15. The method of claim 1, wherein the multi-component single crystal comprises at least a portion of a ternary single crystal boule having a diameter of at least 50 mm, a dislocation density of less than 100 $cm^{-2}$ and a radial compositional variation of less than 1%, and further comprising cutting a wafer having a thickness of less than 1 mm from the boule, wherein the wafer has a diameter of at least 50 mm, a dislocation density of less than 100 $cm^{-2}$ and a radial compositional variation of less than 1%.

16. The method of claim 1, wherein:
the step of providing a solute comprises providing at least two solutes having different characteristics; and
the step of growing comprises growing a boule comprising at least two regions having different characteristics in an axial direction of the boule.

17. A method of growing a multi-component single crystal having three or more elements, comprising:
providing a vessel comprising a crystal growth seed located in a crystal growth area of the vessel and a thermal barrier separating the crystal growth area from a synthesizing melt area of the vessel, wherein at least one opening connects the crystal growth area to the synthesizing melt area;
forming a growth melt in the crystal growth area of the vessel and a synthesizing melt in the synthesizing melt area of the vessel;
providing a solute into the synthesizing melt, such that solute diffuses from the synthesizing melt into the growth melt through the at least one opening; and
growing the multi-component single crystal having three or more elements on the crystal growth seed;
wherein a crystal growth surface is formed over the crystal growth seed;
a temperature difference between the thermal barrier and the crystal growth surface over the crystal growth seed is 1° C. or less; and
a temperature difference between the thermal barrier and a location in the synthesizing melt where the solute is provided is 20° C.

* * * * *